United States Patent [19]

Kulicke, Jr. et al.

[11] 3,894,671

[45] July 15, 1975

[54] SEMICONDUCTOR WIRE BONDER

[75] Inventors: Frederick W. Kulicke, Jr.; John J. Lepone, both of Philadelphia, Pa.

[73] Assignee: Kulicke and Soffa Industries, Inc., Horsham, Pa.

[22] Filed: Jan. 6, 1971

[21] Appl. No.: 104,221

[52] U.S. Cl. .................. 228/4.5; 29/203 B; 29/624; 228/8

[51] Int. Cl. ............................................ B23k 37/04

[58] Field of Search .......... 228/4, 5, 6, 7, 8; 219/85; 29/625, 484, 203 J, 203 B, 624; 78/82

[56] References Cited

UNITED STATES PATENTS

| | | | |
|---|---|---|---|
| 2,637,096 | 5/1953 | Luhn | 29/593 |
| 3,051,026 | 8/1962 | Costa | 78/82 |
| 3,083,595 | 4/1963 | Frank et al. | 78/82 |
| 3,103,137 | 9/1963 | Charschan | 228/6 |
| 3,128,648 | 4/1964 | Clagett | 78/82 |
| 3,149,510 | 9/1964 | Kulicke, Jr. | 78/82 |
| 3,192,358 | 6/1965 | Lasch, Jr. et al. | 219/85 |

*Primary Examiner*—J. Spencer Overholser
*Assistant Examiner*—Robert J. Craig

[57] ABSTRACT

A wire bonder for bonding lead wires between semiconductor dice and package leads reduces by one-half the number of operator decisions required by prior art bonders and is particularly suitable for bonding lead wires from semiconductor dice mounted on bonding pads contained in lead frame strips. During the wire bonding operations, the lead frame strip is clamped against a heater block. A bonding tool, the bonding force being controlled by weights and an over-center spring, supplies a wire to be bonded to the semiconductor die and a package lead. The operator centers the bonding tool over the contact area on the semiconductor die or the package lead by moving the bonding tool, its associated drive mechanism and a spotlight, all mounted on a manipulator plate, until the area to which the wire is to be bonded is in the beam from the spotlight. Special air bearing pads on the manipulator plate ensure that the operator can easily move the bonding tool despite slight misalignments between the manipulator plate and the fixed frame of the wire bonder. Flexible couplings transmit power from the motor to the bonding tool drive mechanism. Adjustable time delays allow the bonding rate of the machine to be adjusted to operator proficiency and to the particular requirements of the bonds being made.

13 Claims, 52 Drawing Figures

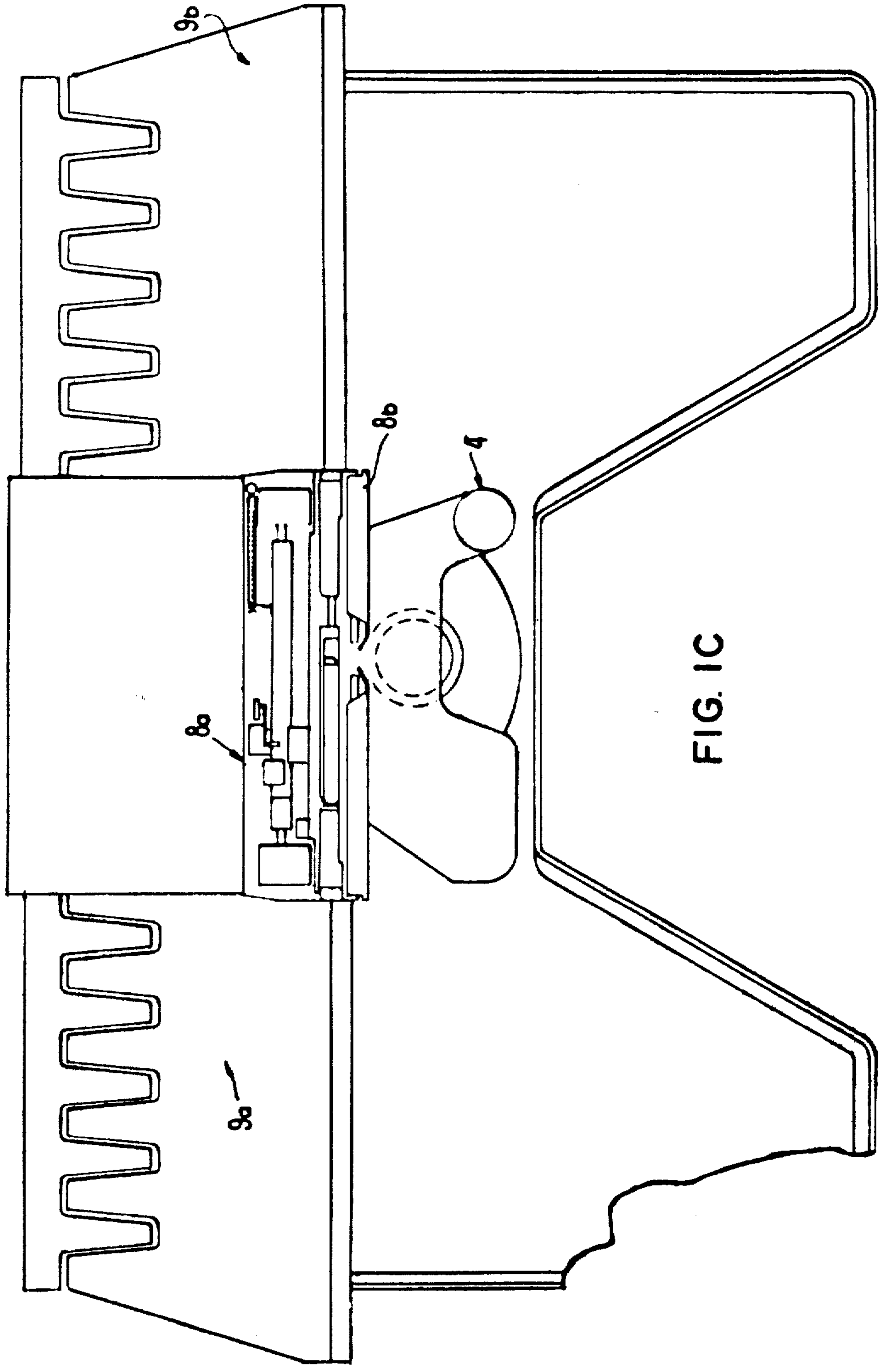
FIG. IC

SEMICONDUCTOR WIRE BONDER

Cross reference to related application.

This application contains material earlier disclosed in U.S. Pat. application Ser. No. 96,213 entitled "Semiconductor Die Bonder."

BACKGROUND OF THE INVENTION

1. Field of the Invention

This invention relates to semiconductor wire bonders and in particular to a wire bonder capable of rapidly bonding the lead wires from the emitter and base regions of a transistor to the emitter and base leads from the transistor package.

2. Prior Art

Semiconductor wire bonders are used to attach wires from a semiconductor die to leads from the package containing the die. Because of the small size of the semiconductor die and the even smaller size of the contact pads on each die to which the lead wires must be attached, an operator must view the semiconductor die through a microscope to form the proper bonds. Typically, the operator moves the substrate containing the semiconductor die until a contact pad on the die is properly located beneath the bonding tool containing the lead wire. Then, the operator presses the end of the lead wire against the contact pad on the semiconductor die and applies heat and pressure or ultrasonic energy to form the bond. The operator then properly positions the substrate and the die such that the external lead from the semiconductor package is beneath the lead wire. The operator then presses the lead wire against the proper package lead and forms a second bond. After this bond is formed, the wire must be cut. Typically this is done either simultaneously with or after removal of the bonding tool from contact with the package lead. The operator then repeats this operation, connecting as many lead wires from the die to the package leads as are necessary.

Obviously, the wire bonding operation is a time-consuming and expensive process. The operator must properly locate each area to which a lead wire is to be bonded beneath the bonding tool before making the bond. Inaccuracies in locating these areas often cause the packaged semiconductor device to be rejected. Furthermore, properly locating the bonding areas beneath the bonding tool is a time-consuming and tiring process inducing operator fatigue and mistakes.

SUMMARY OF THE INVENTION

This invention overcomes some of the limitations of prior art wire bonding machinery. The structure of this invention reduces the number of bonding areas which the operator must align beneath the bonding tool by one-half over the requirements of prior art wire bonders. The structure of this invention is particularly useful in bonding wires to transistor dice mounted on lead frame strips. While the embodiment described uses vertical lead frame strips containing horizontal pads to which the semiconductor dice are bonded, the principles of this invention are applicable to wire bonders using other types of lead frame strips.

According to this invention, a wire bonder contains structure wherein once the operator properly locates and bonds the lead wire to one contact area on the semiconductor die, the second bond required to connect the wire to an external lead from the package is automatically and properly made without the operator visually locating the package lead beneath the bonding tool.

Lead frame strips containing semiconductor dice to which lead wires are to be bonded are held in a carrier placed on a load carrier index deck. A similar carrier on an unload carrier index deck receives lead frame strips to which lead wires have been attached.

A lead frame strip indexing assembly moves the lead frame strip through the wire bonder and a heat rail assembly heats the lead frame strip. In addition, if desired, the lead wire can be preheated as it passes through the bonding tool. A head drive assembly containing a plurality of cams and connecting linkages drives the wire bonder head assembly. Driven by a motor through flexible bellows type couplings, the cams are designed so as to drop the bonding tool (also called the "capillary") with the lead wire attached onto a contact area on the semiconductor die selected by the operator and defined by a beam from a spotlight assembly, and then after the bond has been formed between the lead wire and the contact area on the die, remove the bonding tool from the die. A manipulator assembly is provided by which the operator then automatically displaces the bonding tool, spotlight assembly and associated drive mechansims by the correct amount to properly position the bonding tool above the correct package lead attached to the lead frame. The bonding tool then drops to this package lead and bonds the other end of the lead wire - one end of which is already attached to the semiconductor die - to the package lead. The head drive assembly then clamps the lead wire above the bonding tool, raises the bonding tool from the package lead thereby breaking the lead wire, and finally rotates a torch tube so as to sweep a flame across the wire protruding from the bonding tool, thereby forming a ball on the end of the wire in preparation for the next bond to be formed with the wire to the semiconductor die. The operator then visually observes through a microscope the semiconductor die and properly orients the semiconductor die beneath the bonding tool by moving the manipulator assembly until the next contact area on the die falls in the beam from the spotlight. Again, on pressing a button, the bonding tool with lead wire attached drops to the contact area on the semiconductor die, forms a bond there, and then rises again from the bonding pad. The operator then moves the manipulator assembly so as to properly and automatically again locate the bonding tool above the proper package lead. Upon pressing the button on the manipulator assembly, the bonding tool again lowers onto the next package lead and a bond between the lead wire and the package lead is formed. The head drive assembly then raises the bonding tool from the package lead and simultaneously clamps the lead wire, thereby again breaking the wire at the heal of the package lead bond (sometimes called the post bond) where it is weakest. The torch assembly is again rotated by the drive assembly so as to melt the end of the wire and form a ball on the end.

A spotlight assembly identical to that described in copending application, Ser. No. 27,955 entitled "Aiming Device for Semiconductor Bonding Apparatus" and assigned to Kulicke and Soffa Industries, the assignee of this application, is used to assist the operator in properly locating the contact areas on the semiconductor die beneath the bonding tool. The spotlight assembly is adjusted so that the beam of light from this assembly intersects the plane of the contact areas and package leads directly beneath the bonding tool. When a contact area or package lead is centered in crosshairs contained within the beam of light, the contact area or package lead is properly located with respect to the bonding tool.

Special support pads are used on the manipulator assembly to reduce friction and to compensate for slight unevenesses between the manipulator and its support.

When lead wires are being attached between semiconductor chips containing transistors and the package leads, four adjustable delays are built into the machine cycle. The times at which these delays occur are controlled by slots in a disc driven between a light source and a photo sensor. Actuation of the photosensor by the light passing through the slot triggers each delay. Adjusting the delay allows the wire bonding rate to be adjusted to operator proficiency.

Description of the Drawings

FIGS. 1*a*, 1*b*, and 1*c* show the front, side and top views respectively of selected components of the wire bonding machine of this invention;

FIGS. 3*a* through 3*g* show the head drive assembly and linkages which drive the bonding tool and torch tube assembly used with the wire bonder of this invention;

Detailed Description

While the wire bonder of this invention will be described in terms of the specific embodiment illustrated in the figures, other embodiments incorporating the principles of this wire bonder will be obvious in view of this disclosure. Furthermore, while the wire bonder of this invention will be described in conjunction with the bonding of lead wires from contact pads on a semiconductor die containing a transistor to the external package leads, the principles of this invention can be incorporated in wire bonders used with a variety of other semiconductor devices requiring more or fewer package leads than a transistor.

Figure 1A:
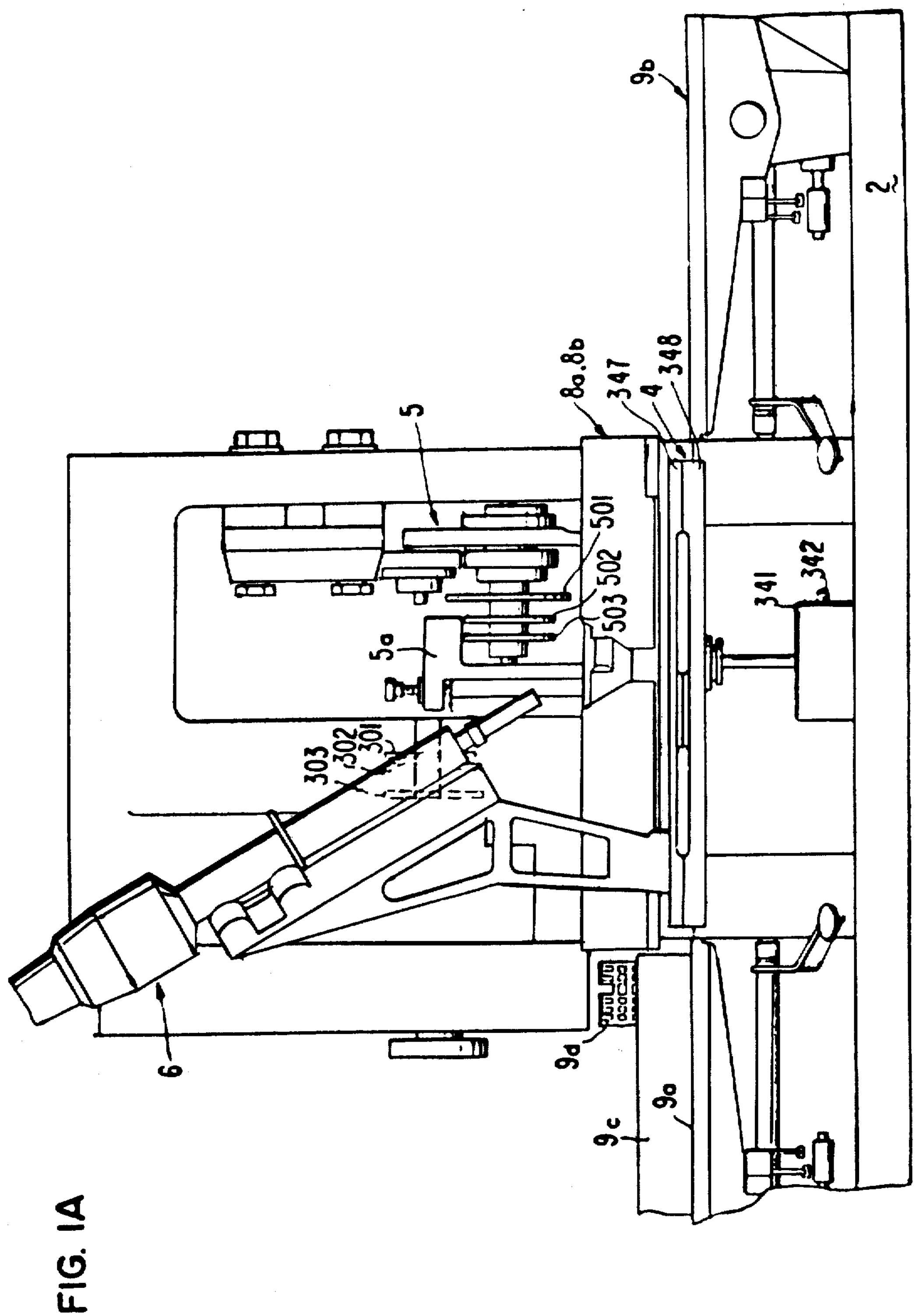

FIG. 1*a* shows the front view of selected components of the wire bonder of this invention. A carrier 9*c* containing vertical lead frame strips 9*d* (shown schematically only) with dice attached is placed on load carrier index deck 9*a*. The strip containing dice to which wires are to be bonded is slipped from the carrier into a slot in heat rail assembly 8*b*. Fingers on strip indexing assembly 8a are then inserted into the lead frame strip and the strip is driven the proper distance to locate the semiconductor dice on the lead frame strip sequentially beneath the wire bonding tool. The lead frame strip is then clamped against a heater block while lead wire is attached to the semiconductor die and the package leads. Cams 301, 302 and 303 together with drive linkages and rollers drive the lead frame strip through the wire bonder, clamp the lead frame strip during the wire bonding operation and control the insertion of fingers into the lead frame strip prior to indexing the strip along the heat rail.

Figure 1B:
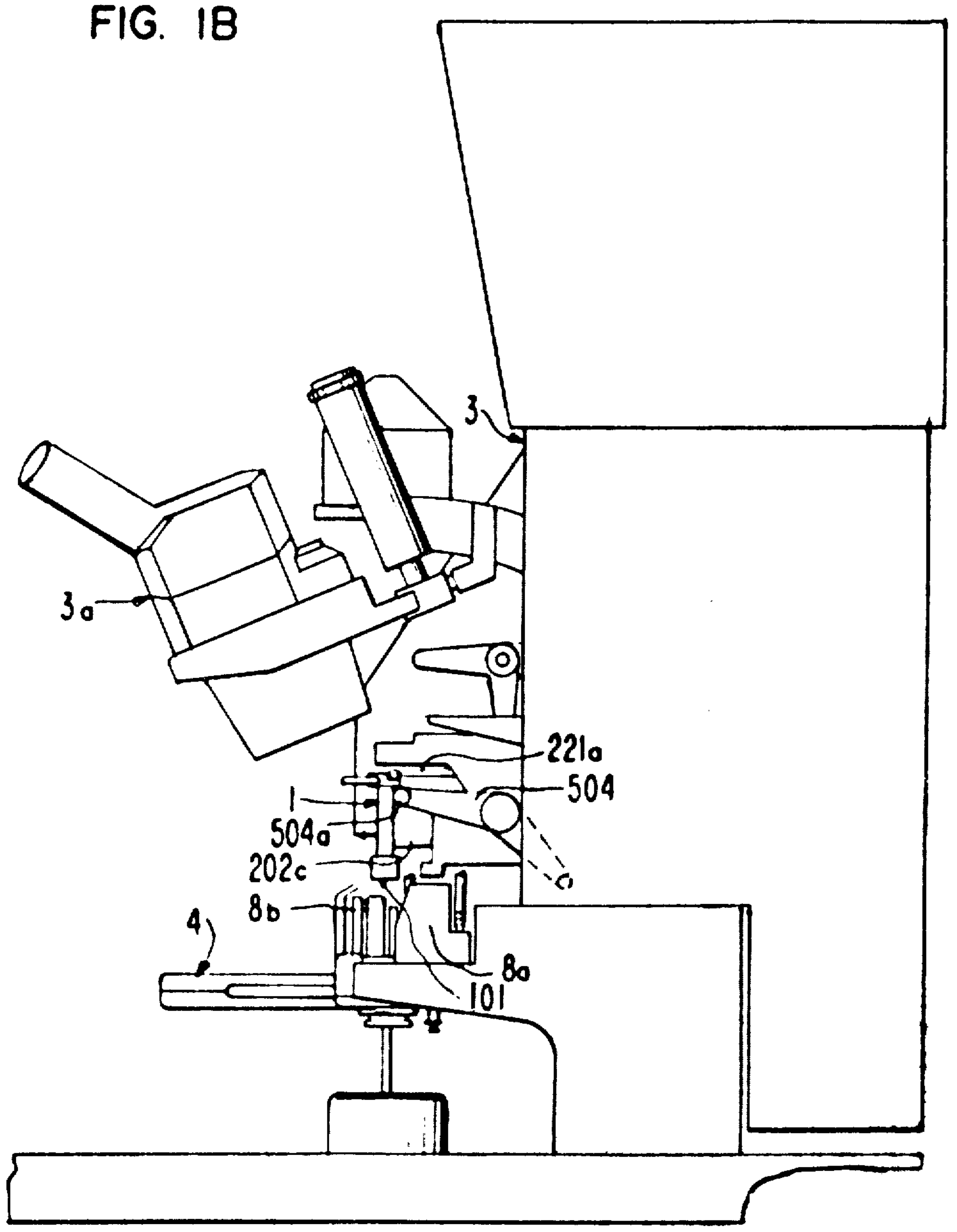

By moving chessman 341 of the manipulator, the operator moves the bonding tool, spotlight assembly and bonding tool driving mechanism until the wire bonding tool 201 (FIG. 1*b*) is above the contact area on the semiconductor die, as indicated by a crosshair in the spotlight from spotlight assembly 6 (FIG. 1*a*). The operator observes this operation through a microscope 3*a* (FIG. 1*b*) mounted in upper frame assembly 3 (FIG. 1*b*). FIG. 1*c* shows a top view of the lead frame strip indexing assembly 8*a*, the heat rail assembly 8*b*, manipulator assembly 4, carrier decks 9*a* and 9*b* and the operator armrests on either side of manipulator 4.

When the bonding tool is properly located above the contact area on the semiconductor die, the operator presses button 342 on chessman 341 in manipulator 4 (FIG. 1*a*). This actuates the lift cam 501 in heat drive assembly 5 to drop the bonding tool onto the contact area and there form the wire bond. When the bond is formed, the wire bonder head assembly is automatically lifted by a drive mechanism actuated by cam 501 to remove the bonding tool from contact with the contact pad. Stops on the manipulator assembly 4 allow the operator to locate automatically the proper package lead or post on the lead frame strip beneath the bonding tool. The lead wire is bonded to the package lead and then the lead wire is clamped by a clamp actuated by wire clamp cam 503 and the lead wire is broken at the heal of the last bond, its weakest point. Flame off cam 502 then rotates a torch tube assembly to form a ball on the end of the lead wire. This process continues until all the dice on the lead frame strip contain the proper number of lead wires connecting their contact areas to the corresponding package leads. The completed lead strip is then discharged into a carrier (not shown but identical to the carrier on deck 9a) mounted on unload carrier index deck 9b (FIG. 1*a*, 1*c*). Throughout this operation, the operator rests his or her arms on extensions on either side of the manipulator 4 (FIG. 1*c*). Chessman 341 of manipulator 4 rests on low friction pads on base assembly 2.

The major sections of the wire bonder of this invention will now be described in detail.

Bonding Head Assembly

Figures 2A, 2B, 2C, 2H:
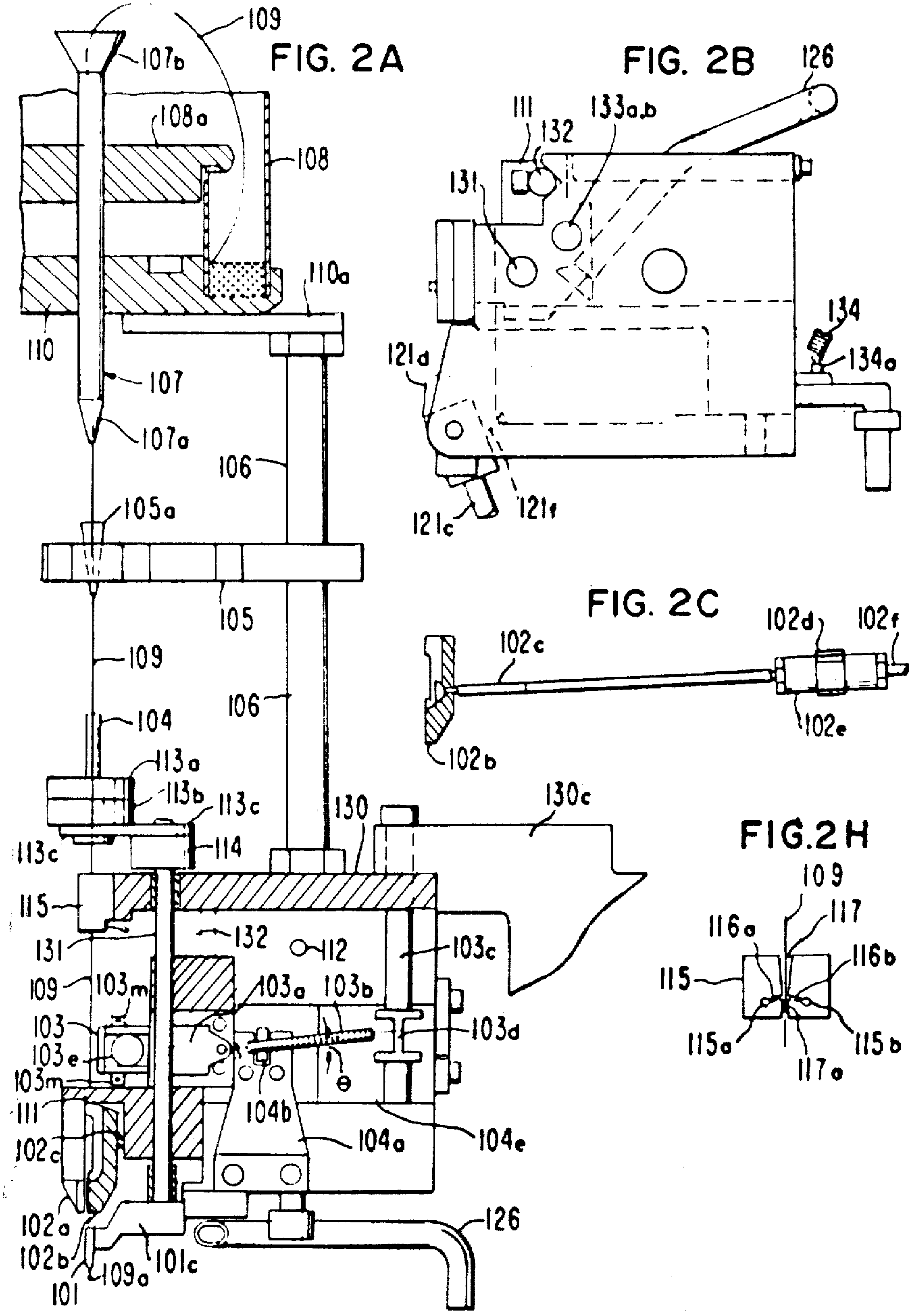
FIGS. 2*a* through 2*h* show in detail the bonding head assembly containing the wire bonding tool used with the wire bonder of this invention.

FIGS. 2*a* through 2g show in detail the bonding head assembly used with the wire bonder of this invention. As shown in FIG. 2*a*, wire 109 is drawn from wire clover 108 and passed through glass feed tube 107. Feed tube 107, containing a conical upper section 107*b* and a tapered bottom portion 107*a*, is supported in a hole in the center of spool seat 110. Spool seat 110 in turn is attached to spool support 110a. Top portion 107b of feed tube 107 flares outward to allow the wire to bend gradually as it enters feed tube 107. Bottom portion 107*a* of feed tube 107 tapers inward to a small diameter to thus center wire 109 for passage through portion 105*a* of upper wire clamp 105.

Figure 2D:
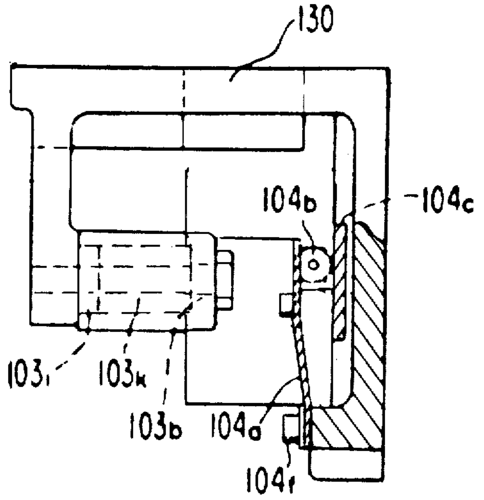
Figure 2E:
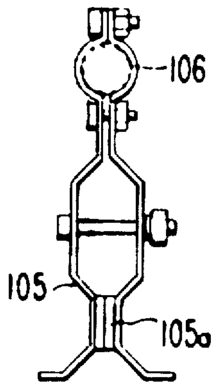

Wire clamp 105, shown in more detail in FIG. 2*e*, is rigidly mounted on spool shaft 106. Shaft 106 (FIGS. 2*e* and 2*f*) in turn is mounted in the top portion of housing 130 containing wire bonding tool 101 and associated drive structure.

Wire 109 passes through glass capillary 105*a*, (FIGS. 2*a* and 2*c*) held in wire clamp 105 by felt pads. Capillary 105a guides wire 109, cleans the wire, and dampens oscillations in the wire caused by the wire feed gas (discussed at end of this section). From capillary 105*a*, wire 109 then passes beside weights 113a and 113b held on post 104 attached to weight support structure 113c and through wire feed gas block 115 where air or other gas pulls up on wire 109. The wire then passes between left side clamp 102*a* and wire clamp 102*b* and through bonding tool 101. The wire which protrudes from bonding tool 101 has a small ball 109*a* on its end, formed by a flame from torch tube 122*a* (FIG. 2*g*) after the wire is broken on completion of each pair of bonds.

Bonding tool 101, which may be ceramic or metal, is supported on a structure slideably mounted within feed block 130. Feed block 130 in turn is mounted through feed block support 130c onto manipulator top plate 347 (FIG. 1*a*) in such a manner that when top plate 347 is moved, bonding tool 101 simultaneously is moved. Also mounted on feed block support 130c is the head drive assembly and drive linkage structure. The head drive assembly is connected to the motor through a flexible bellows coupling so as to allow bonding tool 101 to be moved in any horizontal direction. In addition, bonding tool 101 also moves vertically in a manner to be described in the next section covering the head drive assembly and drive linkages.

Bonding tool 101 is attached through bonding tool holder 101*c* to shaft 131. Bonding tool holder 101*c* contains, in one embodiment, a heater to heat bonding tool 101 and thus to preheat the wire which passes through tool 101. When bonding tool 101 is ceramic this preheater is usually not used. Shaft 131 is slideably mounted in feed block 130. Set screw 114 on the top of shaft 131 allows the initial height of bonding tool 101 to be adjusted. Weight support structure 113*c*, fixed to the top of shaft 131, supports tube 104 beside which wire 109 passes. Surrounding tube 104 are weights 113a and 113b selected to control the weight placed on the wire during the bonding operation. This weight depends upon the bonding conditions and the wire size. In one application of the wire bonder of this invention, these weights total about 60 grams. A wide variety of different weights can, of course, be used depending upon the conditions under which the wire is bonded to the underlying semiconductor die or package leads.

Figure 3A:
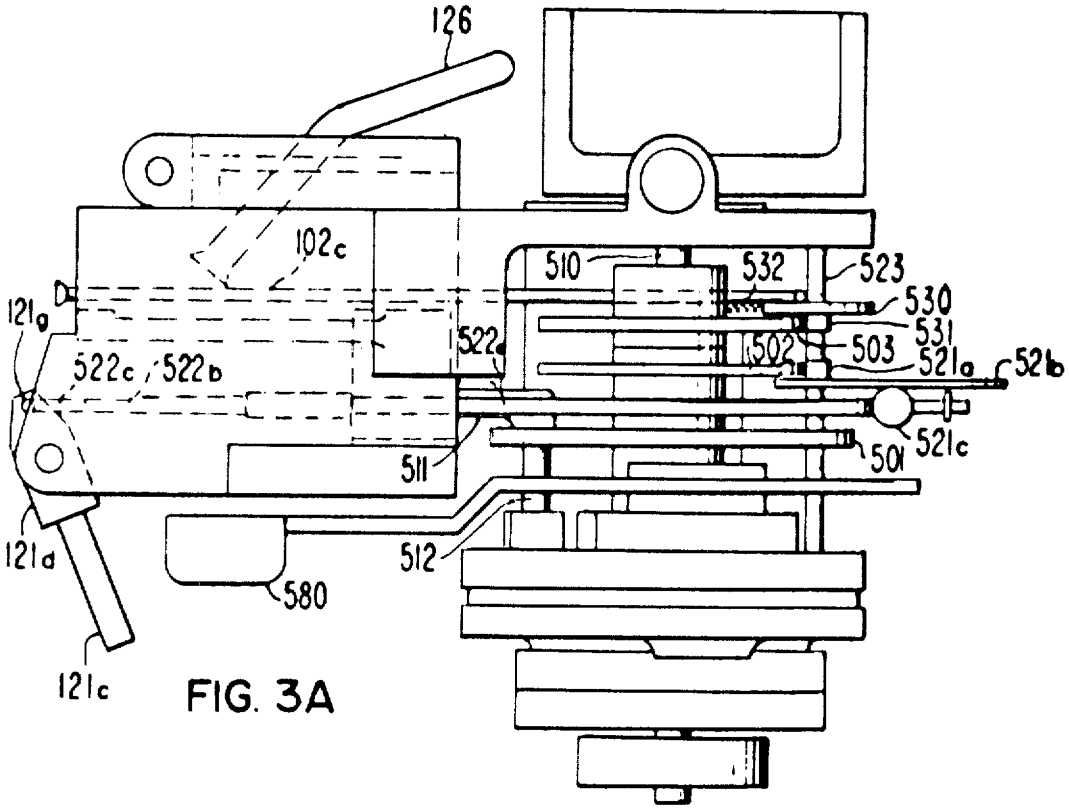
Figure 3B:
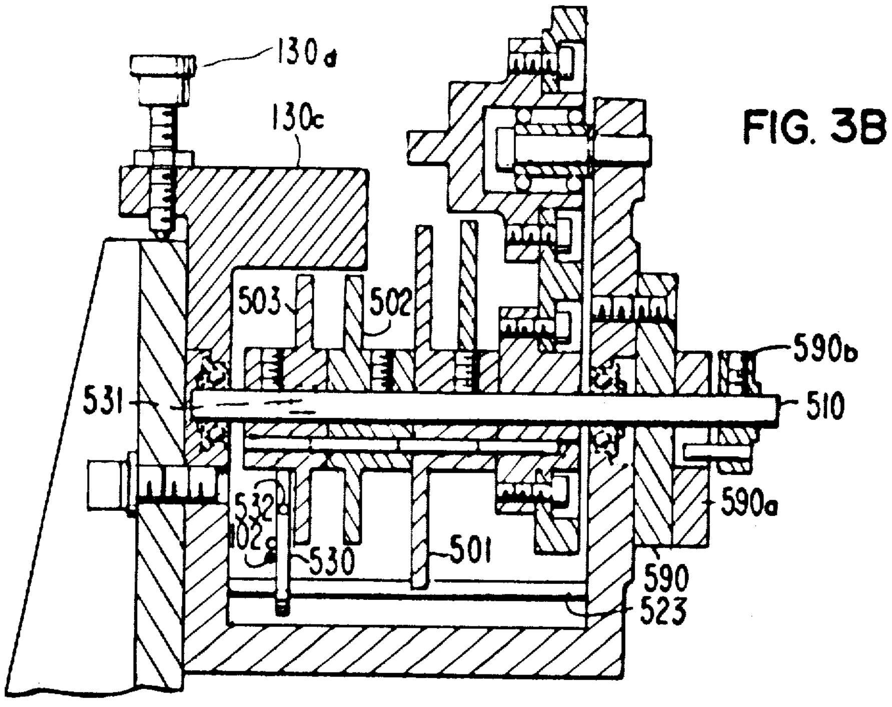
Figure 3C:
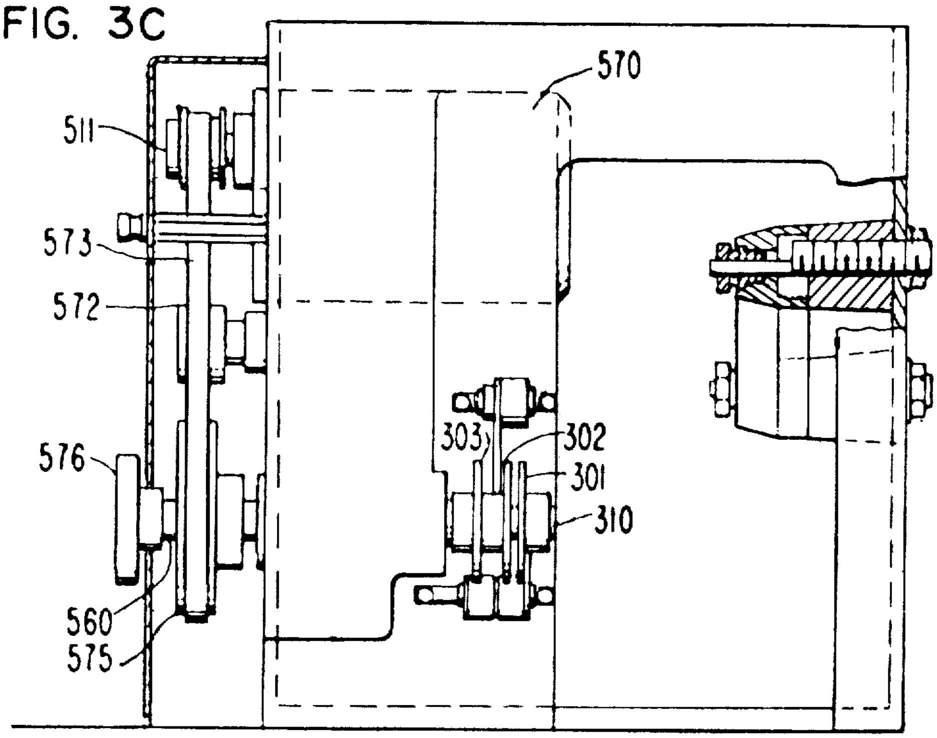

Fixedly mounted on shaft 131 is over-center lever 103. Possessing a box-like structure, lever 103 has bearing 103*e* placed in one of its ends. Bearing 103e is attached to a lever arm which in turn is driven by cam 501 (FIGS. 3*a*, 3*b* and 3*e*). When the operator has correctly positioned bonding tool 101 over the contact area on the semiconductor die or over the package lead to which a wire is to be bonded, as evidenced by this area or lead appearing in the beam of spotlight 6 (FIG. 1*a*), tool 101 is properly positioned to bring the wire into contact with the correct contact area or package lead. At that time, by pressing a button, the operator activates the drive mechanism of the wire bonder such that roller 103e drops vertically in response to rotation of cam 501 (FIG. 1*a*). The vertical force placed on bonding tool 101 is controlled by adjusting the angle $\theta$ made by spring 103*b* attached to extension 103*a* of over-center lever 103. By adjusting threaded screw 103*c* to which spring 103b is attached in region 103*d*, the angle $\theta$ can be increased or decreased thereby increasing or decreasing the upward pull of spring 103*b* on shaft 131 and thus on tool 101. The net result of weights 113*a* and 113*b* and spring 103*b* is that bonding tool 101 places the desired force on wire 109 and thus forms the desired bond between the lead wire and the contact area or package lead. Upon the completion of the bond, cam 501 (FIG. 1*a*) raises bearing 103*e* thus raising over-center lever 103. This raises bonding tool 101. As the shaft and bonding tool are raised, the wire 109, which has just been bonded to the semiconductor die, is drawn through tool 101. To prevent undesired crimps or bends from forming in the wire between the semiconductor die and the package lead, a small upward air draft can be applied to wire 109 as the bonding tool is positioned to bond the lead wire to the package lead.

Next, the operator centers the bonding tool 101 over the appropriate package lead. This, in one embodiment is done automatically by use of stops associated with manipulator assembly 4 (FIGS. 1*a* and 6*a* through 6*d*). By pressing button 342 on the chessman 341 of manipulator assembly, bonding tool 101 is dropped by means of cam 501 onto the package lead. This time, before bonding tool 101 is retracted from the package lead, wire 109 must be broken at the bond. To do this, right side clamp 102*b* is driven against left side clamp 102a by springs 102*c* thereby gripping wire 109 firmly. As bonding tool 101, the associated clamp structure 102a, and 102b and shaft 131 are lifted from the bond by movement of cam 501 (FIG. 3a) transmitted through lever 511 to bearing 103e (FIG. 2f), wire 109 breaks at the heal of the bond, the weakest point of the wire. The force with which right side clamp 102*b* presses wire 109 against left side clamp 102a must be controlled to ensure that wire 109 does not slip between these two clamp pieces, but at the same time is not crushed and badly deformed by the clamp. This force is controlled by controlling the spring constants of springs 102*c* (FIG. 2*a*) placed between right side clamp 102*b* and bonding tool slide 111.

Right side Clamp 102*b* is driven by springs 102*c* against left side clamp 102*a* when clamp actuator rod 102*c* (FIG. 2*c*) moves to the left in response to motion of the clamp cam 503 (FIG. 3*a*). Nut 102*d* (FIG. 2c), part of adjusting knob 102*e*, is used to adjust the position of right side clamp 102*b*.

Bonding tool 101 moves vertically with, and is attached to, plate 104*c* (FIG. 2d). Plate 104*c* moves in bearing slide 104*e* (FIG. 2*a*). As shown in FIG. 2*d*, plate 104*c* is pressed against the right hand, vertical surface of feed block 130 by bearing 104b mounted in side spring 104*a*. Spring 104*a* is firmly attached to housing 130 by screw 104f as shown. Plate 104*c* is attached to overcenter lever 103 and shaft 131 and thus moves vertically with bonding tool 101. Spring 104*a* (FIG. 2d) and bearing 104*b*, however, hold plate 104c firmly against feed block 130.

Figures 2F, 2G:
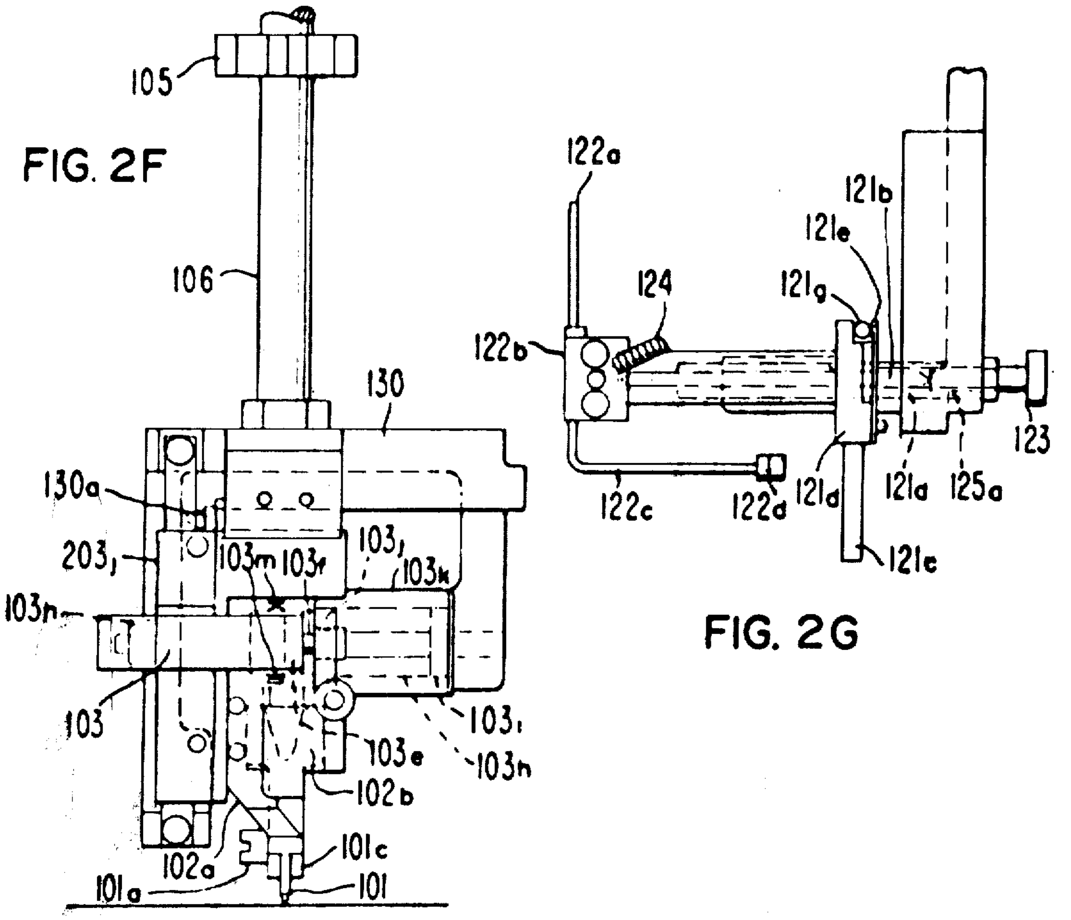

FIGS. 2*b* and 2*g* show in more detail the flame torch, its supporting assembly and the exhaust tube assembly, all used to form ball 109*a* on the end of wire 109 after the wire has been broken. Torch tube 122*a* contains a small flame formed by the burning of hydrogen gas. This flame is rotated by movement of torch tube 122*a* so as to melt the wire end and form ball 109*a* after the wire has been broken. Torch tube 122*a* contains a fitting nut 122*d* for attachment to a source of gas. Adjustment screw 123 allows the height of the flame from tube 122*a* to be adjusted relative to bonding tool 101. Spring 124 attached to the spring hanger on tube support 122*b* pulls upward on the torch tube assembly and holds torch tube 122a at the height to which it is adjusted.

Flame crank assembly rod 121*c* is attached to flame crank assembly 121*d.* End 121*g* of a push rod 522*a,* 522*b* and 522*c*, connected to cam 502 (FIGS. 1*a* and 3*a*, 3*b* and 3*e*) is held between spring 121*e* and flame crank assembly 121*d.* Spring hanger 121*f* (FIG. 2*b*) has attached to it a spring (not shown) for returning torch tube 122*a* to its proper position after actuation by cam 502.

FIG. 2h shows a front view of the wire feed gas block 115 shown in side view in FIG. 2a. Wire 109 passes down through tapered channel 117 containing a narrow neck or restriction 117a. Just above restriction 117a air channels 116a and 116b connect channel 117 to input ports 115a and 115b. Input ports 115a and 115b supply air from a tube connected to an air source. Later, one method of supplying air to ports 115a and 115b as required will be described in connection with FIG. 3g. The air from channels 116a and 116b flows out through channel 117 creating an upward force on wire 109.

Head Drive Assembly and Drive Linkage

FIGS. 3*a* through 3*f* show the drive cams used to actuate the bonding head assembly, the flexible shaft driving these cams, and the linkage connecting these cams to the bonding head assembly.

Figure 3D:
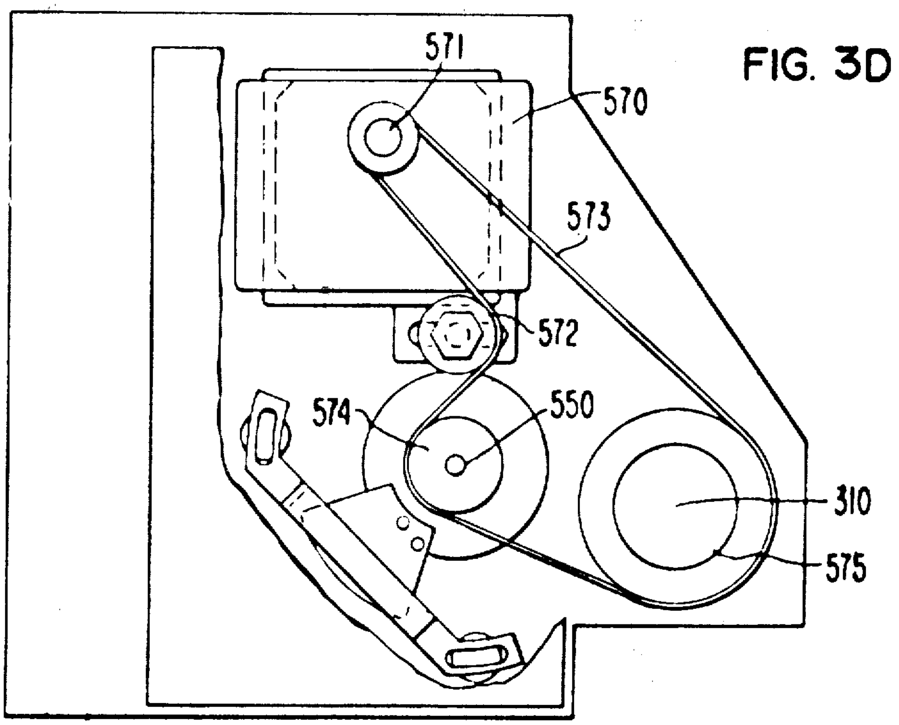
Figure 3E:
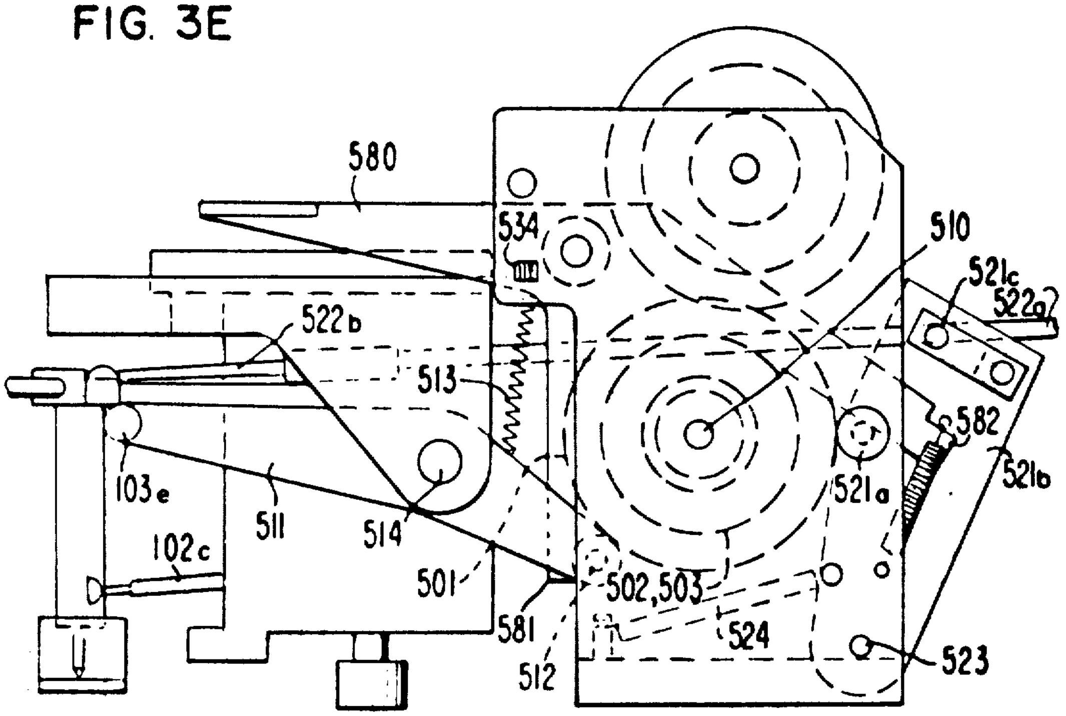

Cams 501 to 503 are mounted on shaft 510 (FIGS. 3*a*, 3*e*) which in turn is driven through flexible coupling 550*b* (FIG. 3*f*), shaft 550 (FIGS. 3*d*, 3*f*) and flexible coupling 550*a* (FIG. 3*f*) by motor 570 (FIG. 3*d*). Motor 570 drives shaft 571 which in turn drives belt 573. Belt 573 (FIGS. 3*c*, 3*d*) drives shaft 550 which drives, through gears, shaft 510 (FIG. 3*a*) containing cams 501, 502 and 503, and shaft 310 (FIG. 3*c*) driving cams 301, 302 and 303 which, as will be described in the next section, drive the lead frame strip indexing mechanism. Shaft 550 (FIG. 3*d*) makes two revolutions for every one revolution of shaft 310. Pulleys 574 and 575 are mounted on shafts 550 and 310 respectively. Knob 576 (FIG. 3*c*) allows the operator to manually rotate cams 501 to 503 and 301 to 303. FIG. 3*c* shows from a front view the relationship of these shafts and pulleys to cams 301 through 303. Shaft 550 is behind shaft 310 and is not shown in FIG. 3*c*. FIG. 3*b* shows in more detail the relationships of cams 501, 502 and 503 to each other and to shaft 510.

Cam 501 (FIGS. 3*a*, 3*b*, 3*e*) drives bonding head 101 (FIG. 2*a*) vertically. As shown in a side view in FIG. 3*e*, roller 512, attached to one end of lever 511 presses against the surface of cam 501. Roller 512 is held against the surface of cam 501 by spring 513, attached by adjustable knob 534 to feed block support 130*c* (not shown). Lever 511 rotates about fixed shaft 514. On the other end of lever 511 is bearing 103*e* which rests in and drives over-center lever 103 (FIG. 2*a*) attached to bonding tool 101.

Cam 502 (FIGS. 3*a*, 3*e*) presses against roller 521*a* attached to lever 521*b* which rotates about dead shaft 523. Attached on the opposite side of lever 521*b* is drive rod 522*a* connected by ball 521*c* to lever 521*b*. Rod 522*a* contains sections 522*b* and 522*c* which terminate in ball 121*g* held between spring 121*e* and end crank assembly 121*d* (FIG. 2*b*, 2*g* and 3*a*).

Cam 503 (FIGS. 3*a*, 3*b*) drives push rod 102*c* which activates clamp 102*b* (FIGS. 2*a*, 2*f*). Rod 102*c* (FIGS. 3*a*, 3*b*) is connected to lever 530 which also rotates about dead shaft 523. Attached to lever 530 (FIG. 2*a*, 2*b*) is also spring 532 which presses roller 531 against the edge of cam 503. Roller 531 transmits the movements of cam 503 to lever 530 thus controlling the motion of rod 102*c* (FIG. 3*e*).

Lockout lever 580 (FIG. 3*e*) allows the operator to prevent bonding tool 101 from dropping onto a semiconductor die or package lead while moving a lead frame strip containing semiconductor dice through the wire bonder. By pressing lockout lever 580, the operator places the end 581 of lever 580 against roller 512 thereby preventing roller 512 from rising and thus preventing bearing 103*e* from dropping. As described above, bearing 103*e* controls the vertical motion of bonding tool 101. Another extension 582 of lockout lever 580 locks lever 521*b* and prevents this lever from moving thereby preventing the torch tube assembly from being rotated while the operator moves the lead frame strip through the wire bonder. This prevents the flame protruding from tube 122*a* (FIG. 2*g*) from melting the wire.

Figure 3F:
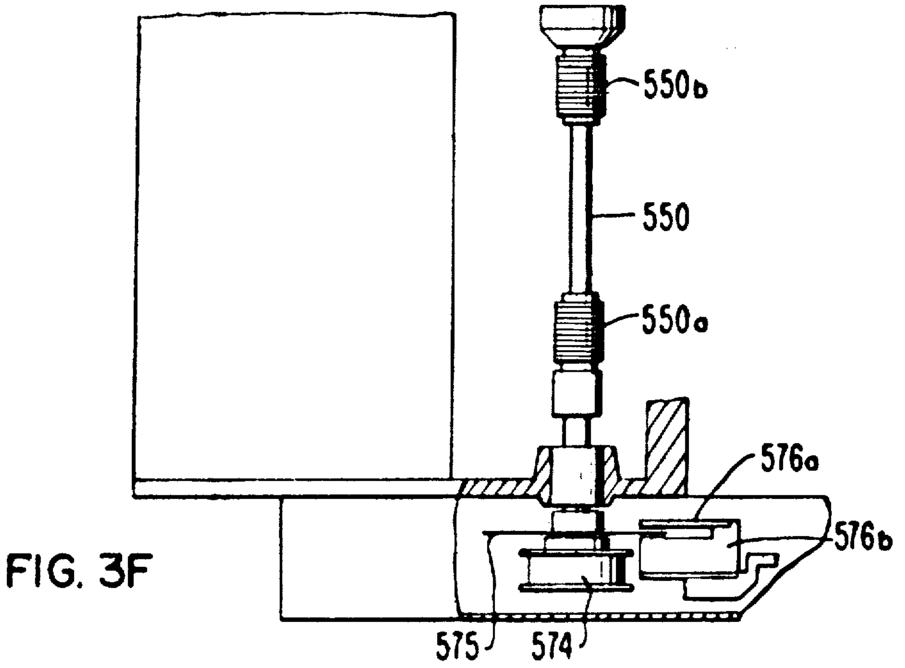

FIG. 3*f* shows the flexible bellows coupling through which motor 570 (FIG. 3*d*) drives shaft 510 (FIG. 3*e*). The housing of shaft 510 is mounted in feed block support 130*c* (FIG. 3*b*), which in turn is rigidly attached to top manipulator plate 347 (FIG. 1*a*). Thus shaft 510 moves with manipulator plate 347 as the operator positions tool 101 above the area to which a wire is to be attached. Flexible bellow couplings 550*a* (FIG. 3*f*) and 550*b* allow the head driving assembly (FIGS. 2*a* to 2*g*) to be moved with manipulator plate 347 by expanding and contracting as required while still transmitting power from motor 570 to shaft 510.

FIG. 3*g* shows the valve structure used to switch air to wire feed gas block 115 (FIG. 2*a*) during the times bonding tool 101 is moving from just having bonded a wire to a semiconductor die to bond the other end of the wire to a package lead post. Working fluid (air or other gas) from a source is transmitted through tubing 591 to the backside of valve disc 590. The working fluid then passes through port 591*b* to the atmosphere. However, when actuator disc 590*a* (FIG. 3*b*) is driven by drive cam 590*b* (FIG. 3*g*), connected to actuator disc 590*a* by drive pin 590*c*, so as to block exhaust port 591*b*, the working fluid passing continuously through tube 591 is forced through tube 591*a*. Tube 591*a* is connected by a hose to wire feed gas block 115 (FIG. 2*a*). Thus periodically when actuator cam 590*a* closes port 591*b*, wire 109 passing through wire feed gas block 115 is pulled up through bonding tool 101 sufficiently to prevent crimps or bends from forming in the lead wire between the semiconductor contact area and the package lead. The wire backfeed gas is on during those portions of each housing cycle as shown in FIG.

8*g*. Actuating disc 590*a* and valve disc 590 are typically made of a low friction material such as Teflon.

Heat Rail Assembly

Figures 4A, 4D:
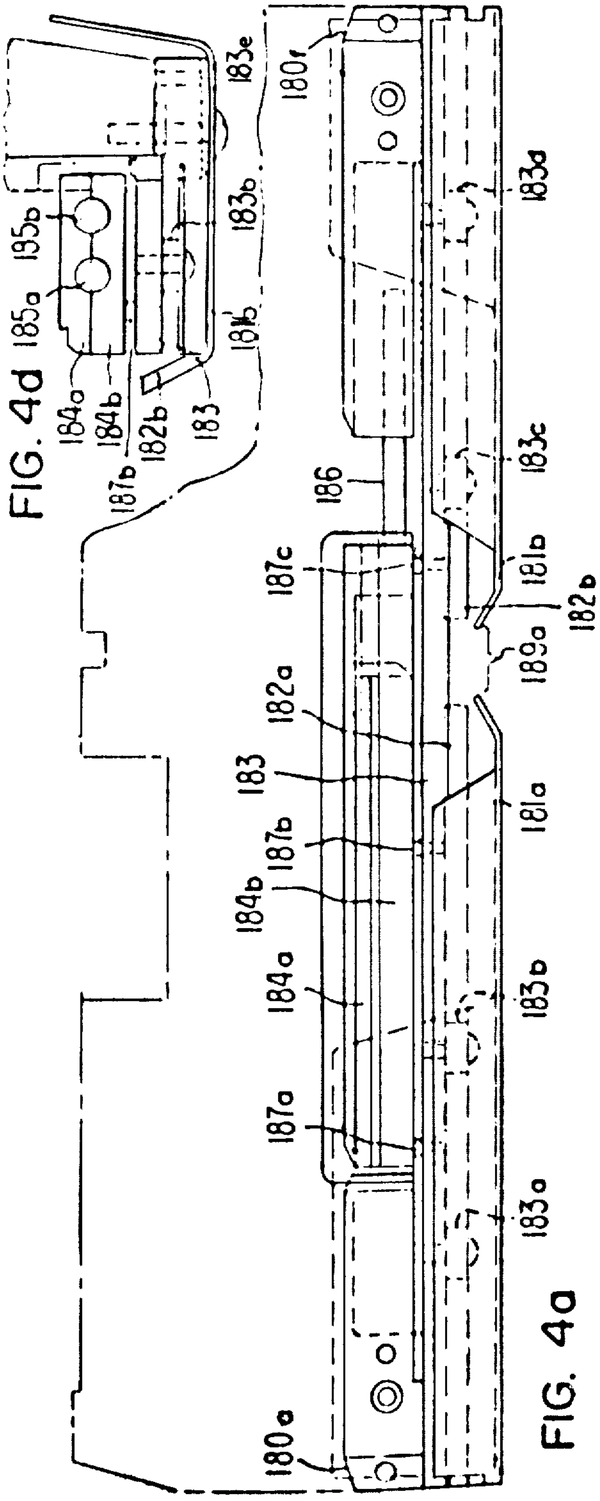
FIGS. 4*a* through 4*d* show top, front and two side views of the heat rail assembly used to heat the lead frame strip containing the dice and package leads to which the lead wires are to be attached.
Figure 4B:
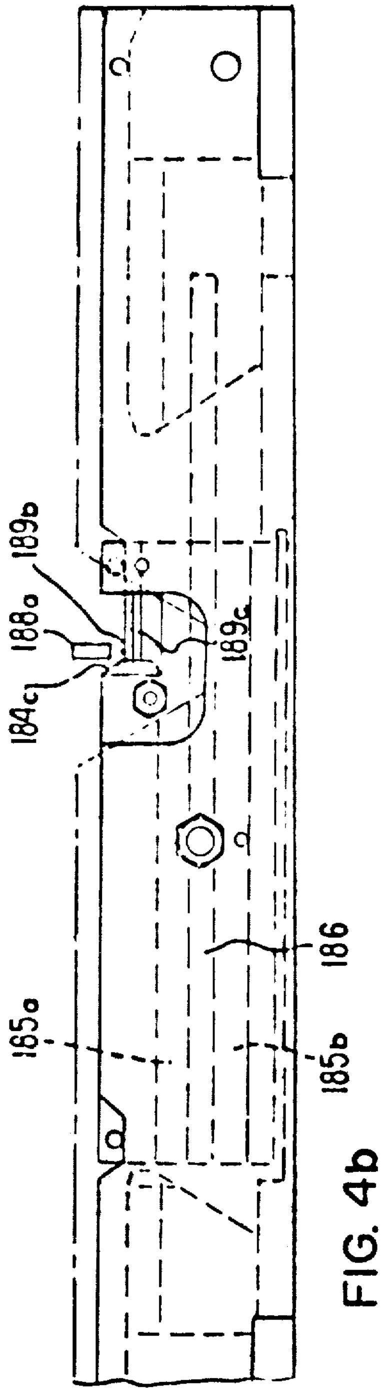

As shown in FIG. 1*a*, the lead frame strip containing the groups of leads with semiconductor dice to which lead wires are to be attached slides from a lead frame carrier 9*c* into slot 188*b* (FIGS. 5*d*, 5*e*) in lead frame heating and indexing assembly 18. FIGS. 4*a* through 4*d* show in more detail the heating portion of the lead frame heating and indexing assembly 18. The lead frame strip enters the heat rail assembly from the left hand strip guide 180*a* (FIGS. 4*a*, 4*b*). The lead frame then travels along the strip guide passing by heater blocks 184*a* and 184*b*. Blocks 184*a* and 184*b* are typically constructed of stainless steel. Running along blocks 184*a* 184*b* in grooves on the interior of abutting faces of these blocks are cartridge heaters 185*a* and 185*b* (FIGS. 4*b*, 4*d*). Heaters 185*a* and 185*b* heat heater blocks 184*a* and 184*b* to a selected temperature. In addition, gas tube 186 allows a heated gas, typically nitrogen, to pass from the heater blocks 184 through passages (not shown) over the semiconductor dice and package leads on the lead frame strip to assist in heating these parts. The heater block temperature is sensed by thermocouple 189*c* - located directly beneath bonding point 188*a* (FIGS. 4*b*, 4*c*) - which generates a signal which is sent to the circuit controlling the current supplied to cartridge heaters 185*a* and 185*b*. Thus the temperature of heater blocks 184*a* and 184*b* is carefully controlled to match the temperature desired to form the wire bond between a die and a package lead. The temperature control circuit works in a well-known manner and thus will not be described.

Figure 4C:
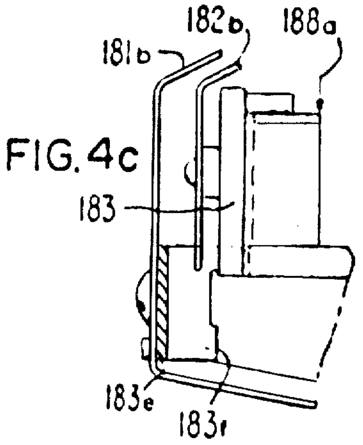

The lead frame strip is driven along heater block 184*a* until the semiconductor die to which lead wires are to be attached is opposite opening 189*a* (FIG. 4*a*) between left hand heat guard 181*a* and right hand heat guard 181*b*. Heat guards 181*a* and 181*b* protect the operator from coming into contact with left hand heat shield 182*a* and right hand heat shield 182*b*. These heat shields in turn are held away from front plate 183 – which extends from the left hand edge of left hand strip guide 181*a* to the right hand edge of right hand strip guide 181*b* - by spacers 183*a* through 183*d*. In addition, heat insulator 183*e* is located between the heat guards 181*a* and 181*b* and the toe clamp 183*f*, as shown in FIG. 4*c*. Front plate 183 in turn is held away from the heater block 184*b* by spacers 187*a*, 187*b* and 187*c* (FIGS. 4*a*, 4*d*). Between left hand heat guard 181*a* and right hand heat guard 181*b* is a gap 189*a*.

The lead frame strip is moved along the heat rail assembly by an indexing mechanism shown in the next section.

Index Strip Assembly

FIGS. 5*a* through 5*g* show various views of the components of the assembly for indexing the lead frame strip. This assembly contains three basic subassemblies:

1. A clamp paddle assembly for clamping the lead frame strip in proper position against the heater blocks 184*a* and 184*b* (FIGS. 4*a*, 4*b*, 4*c*) during the bonding of the lead wire to the semiconductor die and the package leads;

2. An index finger bar containing two fingers for engaging the lead frame strip to drive the lead frame strip along the heater rail thereby to move the semiconductor die to which lead wires were previously bonded from the bonding position and to bring the next semiconductor die into proper position for bonding of lead wires thereto; and 3. An index finger bar support mechanism which slideably rests in support blocks and which moves the index finger bar back and forth parallel to the lead frame strip so as to properly position and then drive the index finger bar and thus move the lead frame strip.

All three subassemblies are mounted on base plate 201 (FIGS. 5*a*, 5*b*, 5*c*, 5*f* and 5*g*). Throughout the following description, the index finger bar support and its components are denoted in combination with letters by numbers 202 through 211, the clamp paddle assembly is denoted in combination with letters by numbers 220 through 231 and the index finger bar assembly is denoted in combination with letters by numbers 240 through 250.

Figure 5H:
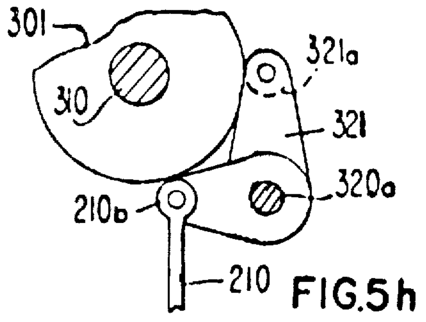
FIGS. 5*a* through 5*i* show the index and drive assembly used to index the lead frame strip along the heat rail.
Figure 5I:
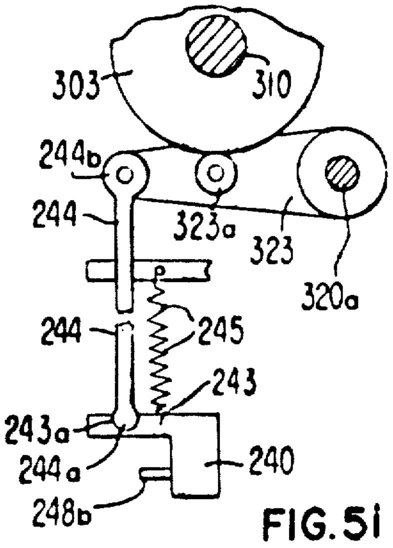
Figure 5A:
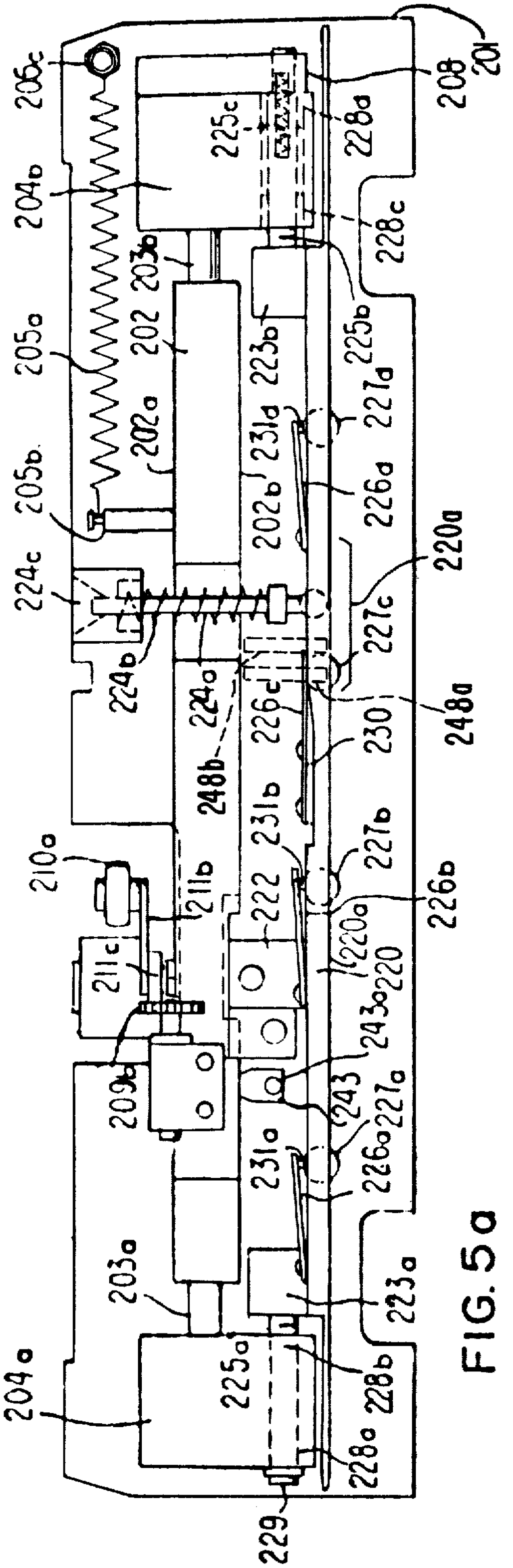
Figure 5C:
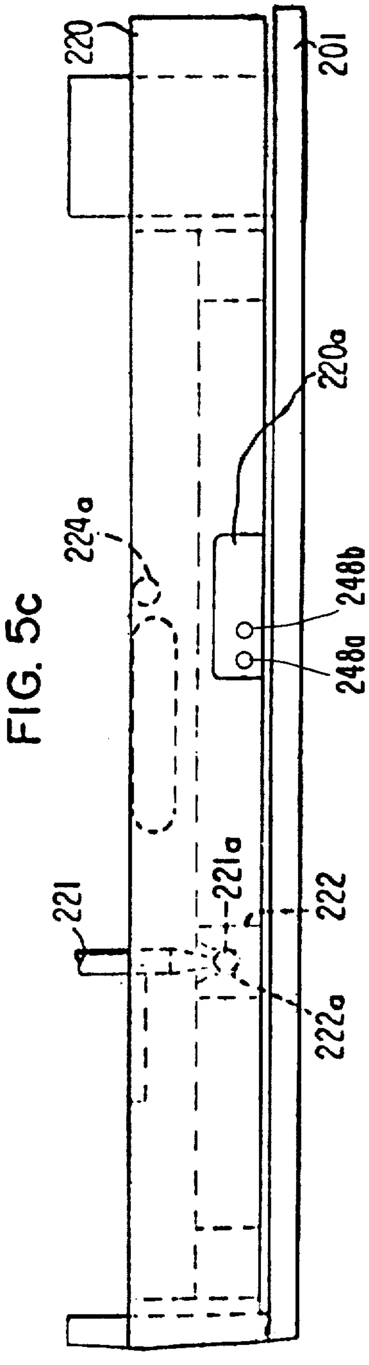
Figures 5B, 5F:
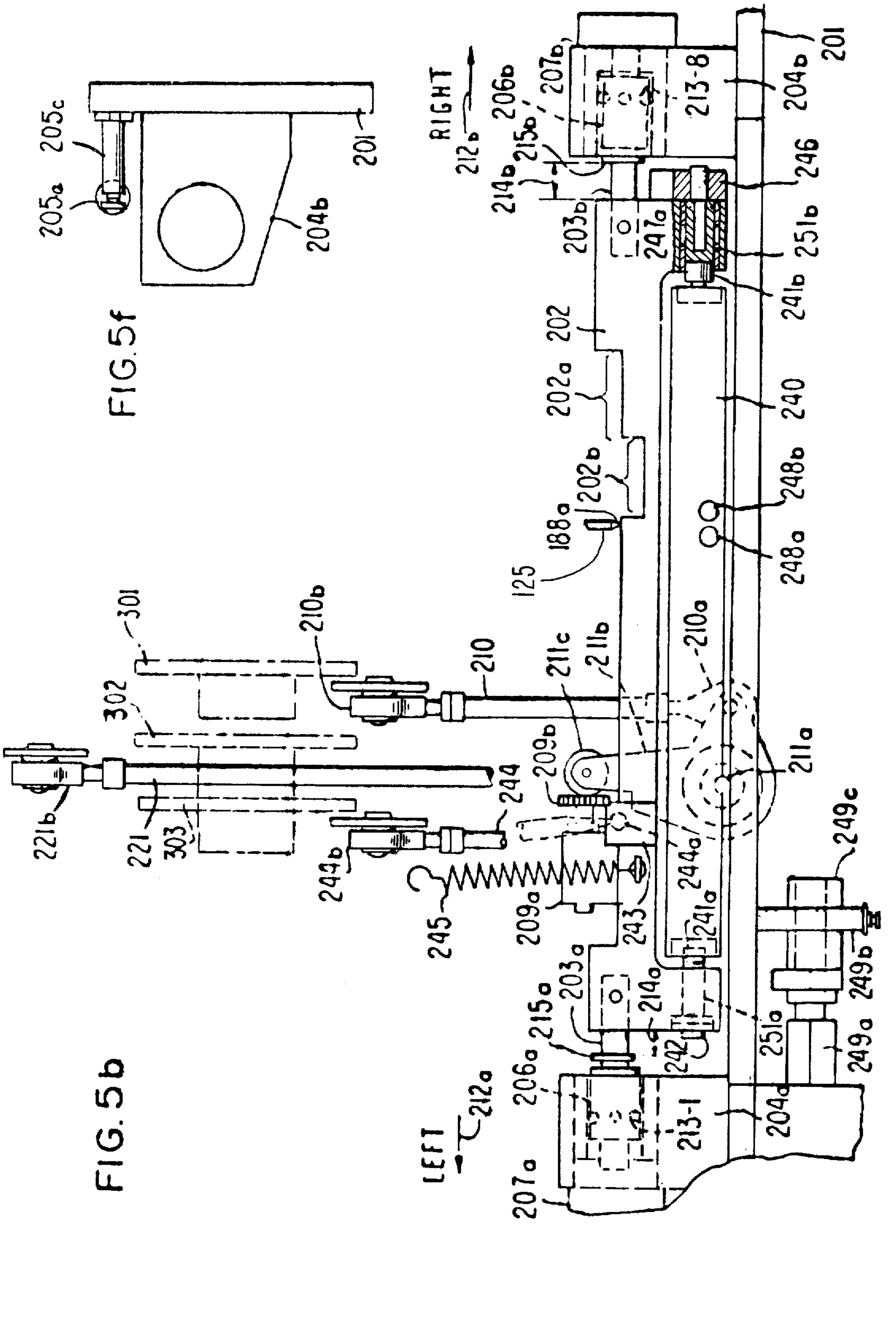
Figures 5D, 5E, 5G:
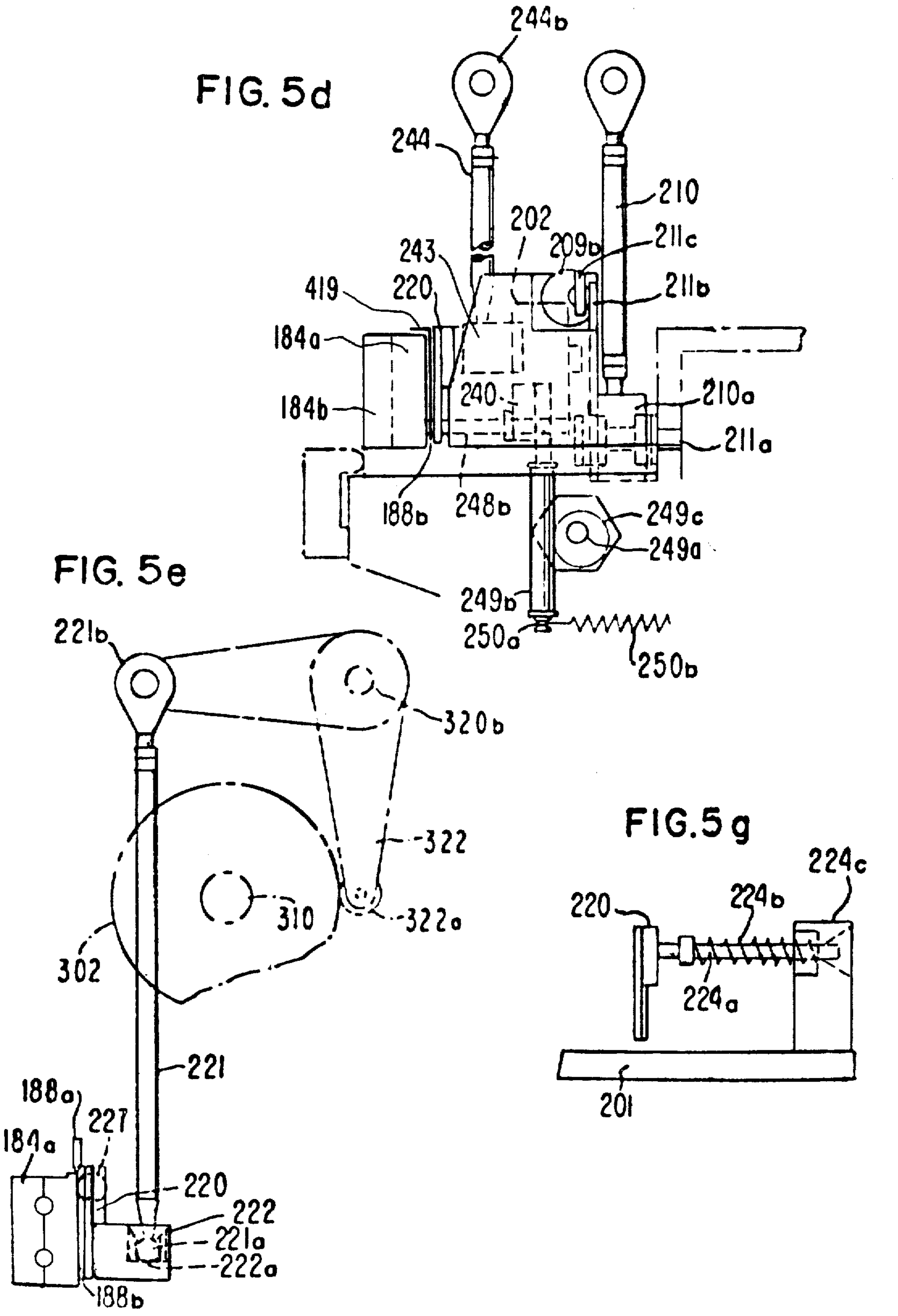

Index finger bar support 202 (FIGS. 5*a*, 5*b* and 5*d*) supports index fingers 248*a* (FIGS. 5*b*, 5*d*, and 6*f*) which drive the lead frame strip 419 (FIG. 5*d*) containing the bonding pads along slot 188*b* (FIG. 5*d*). Support 202 is mounted on end block assemblies 204*a* and 204*b* by means of pivot shafts 203*a* and 203*b*. Located on bar support 202 is feed adjust block 209*a* (FIG. 5*b*) containing feed stroke adjustor 209*b*. Stroke adjustor 209*b* can be moved into or out of feed adjust block 209*a* to adjust the positions to which index finger bar support 202 is driven in the horizontal direction. Bar 202 is driven to the left or right as denoted by arrows 212*a* and 212*b*, respectively (FIG. 5*b*).

Index finger bar support 202 is driven to the left in the direction of arrow 212*a* by means of index push rod 210 attached through rotable connector 210*a* to one part of L-shaped lever 211*b*. Lever 211*b* rotates about fixed index pivot stud 211*a* in response to upward or downward motion of index push rod 210. Push rod 210 is connected by a rotatable connector 210*b*, also called a Heim bearing, to a lever 321 (FIG. 5*h*) in contact with cam 301 (FIGS. 5*b*, 5*h*). Cam 301 is located on the single drive shaft 310 and is driven by motor 570 (FIGS. 3*c*, 3*d*). In response to the movement of this cam, push rod 210 (FIGS. 5*b*, 5*h*) rises, forcing roller 211*c* (FIG. 5*b*), connected to one end of lever 211*b*, against the face of stroke adjustor 209*b*. Stroke adjustor 209*b*, connected through feed adjust block 209*a* to the index finger bar support 202, then drives index finger bar support 202 to the left in the direction of arrow 212*a*. Index finger bar support 202 is supported in end blocks 204*a* and 204*b* by ball bearings 213-1 through 213-8 (FIG. 5*b*). In FIG. 5*b*, only six of these balls are shown in detail but it should be understood that four balls are located equidistant around pivot shafts 203*a* and 203*b* to provide rotating, low-friction supports for these shafts.

The position of the lead frame strip on the heater block 184*a* (FIG. 4*a*), can be adjusted by adjusting stroke adjustor 209*b*. Moving stroke adjustor 209*b* to the right moves index finger bar support 202 to the left and vice versa. Grip rings 215*a* and 215*b* are keepers for bearings 206*a* and 206*b* respectively.

FIG. 5*d* shows an end view of the location of index finger bar support push rod 210 with respect to index finger bar support 202.

FIG. 5*f* shows an end view of the relationship of base plate 201 to right side end block 204*b*.

As shown in FIG. 5*a*, index finger bar support 202 is pulled to the right in the direction of arrow 212*b* (FIG. 5*b*) by a preloading spring 205*a* attached to spring hanger 205*b* rigidly protruding from the back face 202*a* of support 202 and, at the other end, to spring hander 205*c* rigidly attached to base plate 201 as shown in FIG. 5*f*. Depression 202*b* (FIG. 5*b*) formed in support 202 allows support 202 to move in the horizontal direction beneath shaft 224*a* (FIG. 5*a*) connected to clamp paddle 220. The function of shaft 224*a* will be explained later in this section when the clamp paddle is described.

Rotably attached to bar support 202 is index finger bar 240 (FIG. 5*b*). Finger bar 240 is rotably attached to pivot studs 241*a* and 241*b* which rest on bearings 251*a* and 251*b*. Pivot stud 241*a* is rigidly mounted to part 202. Stud 241*b* is slideably mounted in bearings 251*b*. Bearings 251*a* and 251*b* allow index finger bar 240 to rotate about a horizontal axis running longitudinally along finger bar 240. Preload spring 247*a* located within pivot stud 241*b* holds finger bar 240 firmly in its proper position relative to finger bar support 202. Spring 247*a* is held in stud 241*b* by load spring capture block 246. This preload spring absorbs growth caused by thermal expansion of index finger bar 240.

Protruding from the front face of index finger bar 240 are index fingers 248*a* and 248*b* (FIGS. 5*b*, 5*d*). These fingers (Shown are round, but which can also be other shapes if desired) protrude through opening 220*a* (FIG. 5*c*) in clamp paddle 220 (See also FIG. 5*d*) and pass through mating holes (not shown) in the vertical lead frame strip 419 (FIG. 5*d*) in slot 188*b* (FIG. 5*d*). Thus when index finger bar support 202 is drawn back to the right in the direction of arrow 212*b* (FIG. 5*b*) by spring 205*a* (FIG. 5*a*) after having been driven to the left by the rising of index push rod 210, fingers 248*a* and 248*b* have been inserted into the lead frame strip to drive this strip in the direction of arrow 212*b*. At completion of the feed, these fingers then "tuck" the strip down against the heater block 184 (FIG. 5*d*).

Fingers 248*a* and 248*b* are inserted into the lead frame strip 419 (FIG. 5*d*) by the motion of finger pivot push rod 244 driven through Heim bearing 244*b* (FIG. 5*b* and 5*d*) by cam 303 (FIG. 5*i*) mounted on shaft 310 (FIGS. 3*c*, 3*d*, and 5*i*). Push rod 244 is raised by a spring 245 (FIG. 5*i*) as cam 303 rotates. Simultaneously, spring 245 (FIGS. 5*b*, 5*i*) pulls up on the front portion of index finger pusher block 243 (FIG. 5*i*) on support 202. Block 243 is in contact with ball 244*a* on the end of push rod 244. The movements on index finger bar 240 are such that fingers 248*a* and 248*b* are inserted into mating holes in a lead frame strip. FIG. 5*i* shows this structure schematically only.

The relative distance between the lead frame strip 419 in slot 188*b* (FIG. 5*d*) and index finger bar 240 is controlled by the position of eccentric 249*c* (FIGS. 5*b*, 5*d*) which rotates about pivot stud 249*a*. Spring hander 250*a* (FIG. 5*d*) is attached to pivot sleeve 249*b*. Spring 250*b* in turn is attached to pivot hanger 250*a* and the frame of the die bonder. Rotating finger control eccentric 249*c* adjusts to the left or right (FIG. 5*d*) the position of index finger bar 240 by rotating index finger bar support 202 about its pivot shafts 203*a* and 203*b* (FIGS. 5*a*, 5*b*).

Index finger alignment screw 242 (FIG. 5*b*) allows the position of bar rod 240 to be adjusted to the left or right in the direction of arrows 212*a* or 212*b*, as desired.

When the lead frame strip 419 in slot 188*b* (FIG. 5*d*) is in the proper position to have lead wires bonded to the semiconductor die and the package posts, clamp paddle 220 (FIGS. 5*a*, 5*c*, 5*d*, 5*e*, 5*g*) is pressed firmly against the lead frame strip to force this strip against heater block 184*a*. Clamp paddle 220 is driven by clamp push rod 221 (FIG. 5*c*). Push rod 221 (FIGS. 5*a*, 5*b*, 5*e*) contains a Heim bearing 221*b* connected to lever arm 322 (FIG. 5*e*) which is driven by cam 302 (FIG. 5*e*) on shaft 310 (FIGS. 3*c*, 3*d*, and 5*e*). Normally, push rod 221 pushes down on clamp paddle pusher block 222 by means of ball 221*a* placed in socket 222*a*. Pusher block 222 is attached to clamp paddle 220. As shown in FIG. 5*a*, clamp paddle 220 contains on its inside face preloaded springs 226*a*, 226*b* and 226*d* in addition to spring pick-up plate 226*c*, all positioned so as to press against sperical balls 227*a*, 227*b*, 227*c*, and 227*d*. Preloading pads 231*a*, 231*b*, and 231*d* are attached to springs 226*a*, 226*b* and 226*d*, respectively.

When clamp push rod 221 is moved upwardly by cam 302 attached to drive shaft 310 (FIG. 5*e*), spring 224*b* (FIGS. 5*a*, 5*g*) - attached at one end to preloading block 224*c* and at the other end to a stop on shaft 224*a* - drives shaft 224*a*. Shaft 224*a*, which is attached to clamp paddle 220, drives paddle 220 against the lead frame strip 419 in slot 188*b* (FIG. 5*d*). At this instant, the balls 227*a* through 227*d* (FIG. 5*a*) press against adjacent holes in the lead frame strip 419 and push the lead frame strip 419 solidly against heater block 184*a* (FIGS. 4*a* through 4*c*).

When push rod 221 (FIGS. 5*b*, 5*e*) is again pushed downward, clamp paddle 220 pivots about clamp paddle pivot studs 225*a* and 225*b* (FIG. 5*a*) so as to remove sperical pressure balls 227*a* through 227*d* from contact with the lead frame strip.

Bearing blocks 223*a* and 223*b*, attached to the back side of clamp paddle 220 (FIG. 5*a*), contain bearings. These bearings allow the clamp paddle to rotate about pivot stud 225*a*, which is fixed rigidly to left end block 204*a*, and pivot stud 225*b*, which is slideably mounted in right end block 204*b*. Bearing blocks 223*a* and 223*b* rotate about pivot studs 225*a* and 225*b* on bearings contained in blocks 223*a* and 223*b*. While pivot stud 225*a* is fixed rigidly to end block 204*a*, stud 225*b* is free to slide in sleeve bearings 228*c* and 228*d* (FIG. 5*a*). Preload spring 225*c* contained in stud 225*b* is designed to absorb thermal expansion and contraction of the clamp paddle and associated parts so as to maintain the dimensional accuracy of the system.

As shown in FIG. 5*c*, clamp paddle 220 contains an opening 220*a* through which protrude index fingers 248*a* and 248*b* (FIGS. 5*b*, 5*d*). Opening 220*a* allows fingers 248*a* and 248*b* to move in the direction of arrows 212*a* and 212*b* (FIG. 5*b*). The clamp paddle likewise has an alignment screw 229 (FIG. 5*a*) which can be used to adjust the horizontal position of the clamp paddle with respect to the lead frame strip.

Spring 226*c* (FIG. 5*a*), separated from clamp paddle 220 by spacer 230, presses ball 227*c* against the lead frame strip. Ball 227*c* is designed to press against the lead frame strip directly adjacent the semiconductor die to which the lead wires are being bonded at location 188*a* (FIG. 5*b*).

To summarize, the lead frame strip index assembly contains three components, the index finger bar support, the index finger bar itself, and the clamp paddle. The index finger bar support is driven horizontally back and forth and carries with it the index finger bar 240.

Index finger bar 240 is rotated about its supports attached to the index finger bar support 202 so as to insert fingers 248a and 248b into, and to remove fingers 248a and 248b from, the lead frame strip at the proper times. Once each cycle clamp paddle 220 is pressed against the lead frame strip to hold this strip in proper position for the bonding of lead wires to a semiconductor die and the corresponding package leads. All motions, both linear and rotational, of the index finger bar support 202, index finger bar 240 and clamp paddle 220 are derived from cams contained on shaft 310 driven by motor 570.

Manipulator Assembly

Figures 6A, 6B, 6C, 6D, 6E:
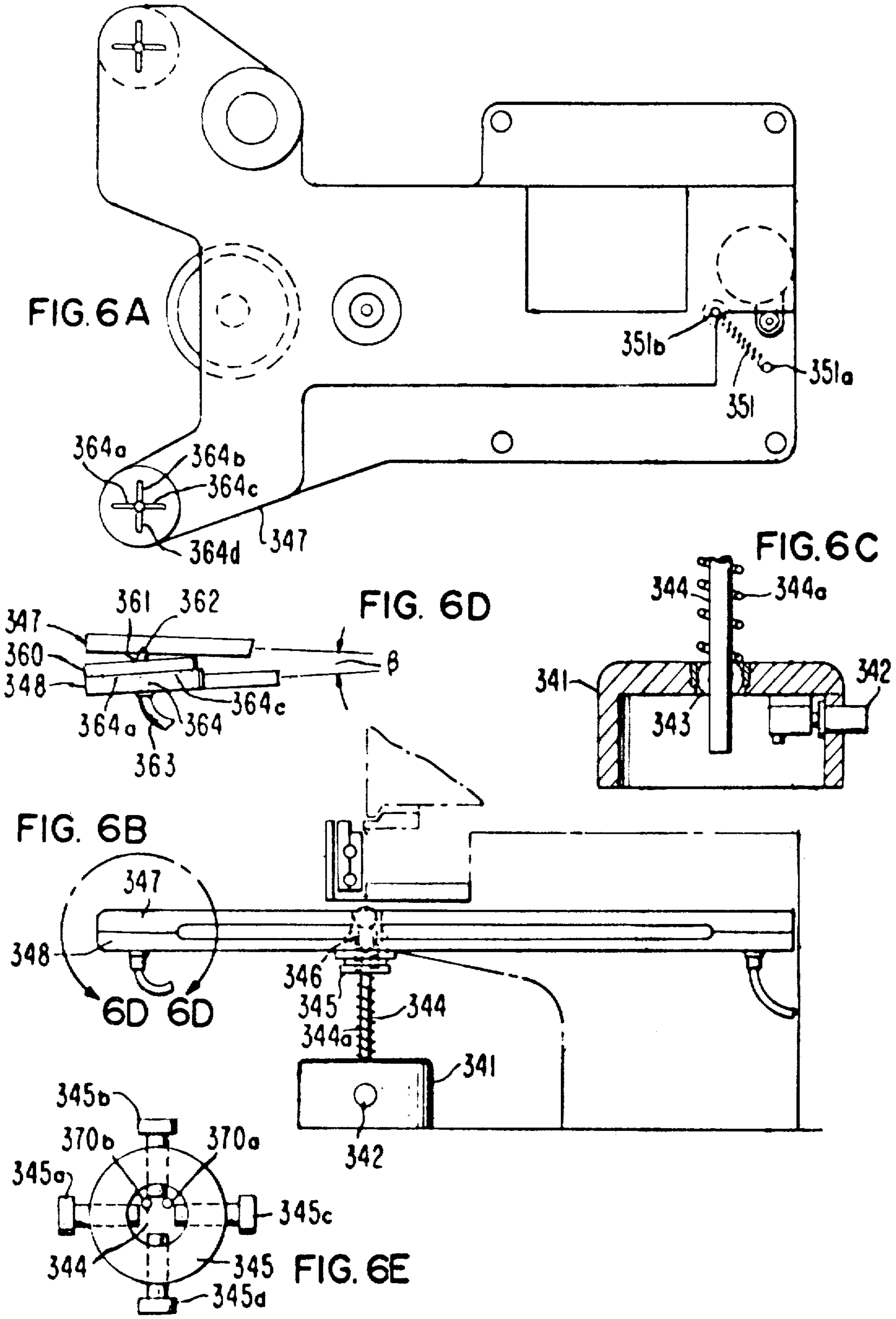
FIGS. 6*a* through 6*e* show in detail the manipulator assembly used to properly position the bonding tool above the lead frame strip and the semiconductor die.

As shown in FIG. 1a, the manipulator assembly contains a top plate 347 resting on bottom plate 348. As shown in FIGS. 6a through 6e, plate 347 rests on compensating pads 360 which in turn rest on air bearings on pads in bottom plate 348. FIG. 6b shows in more detail the unique construction of these bearings. To compensate for any angle (such as angle $\beta$) between the plane of the bottom portion of top surface 347 and the plane of the top portion of bottom surface 348 in the vicinity of each bearing, a pad 360 with a protrusion 361 (which serves as a pivot point) in the center of its top surface, rests between bottom plate 348 and top plate 347. A notch 362 in the bottom surface of top plate 347 receives protrusion 361. Thus pad 360 can pivot about protrusion 361 and thus compensate for any angle, such as the angle $\beta$ shown in FIG. 6d, between the planes of the facing surfaces of plates 347 and 348 in the vicinity of the bearing. Without this flexible pad, small but different angles between the planes of the facing surfaces of each bearing result in a large increase in friction and thus a large increase in the force required to move top plate 347 with respect to bottom plate 348. (There are three such bearings between plates 347 and 348). Hose 363 passes air or other gas under pressure to channel 364 which connects to radial groves 364a to 364d in the top surface of plate 348. Thus pad 360 rests on a slight cushion of air. This reduces the friction required to move plate 347 relative to plate 348.

FIGS. 6d and 6c show in more detail the way top plate 347 is moved relative to bottom plate 348. The operator moves chessman 341 by his hand. In the center of the top surface of chessman 341 is a ball bearing 343 containing through its center, shaft 344. Around the outside surface of shaft 344 is spring 344a which produces a downward force on manipulator 347 holding it against plate 348 and holding chessman 341 firmly against the smooth horizontal surface of the wire bonder base (see FIGS. 1a to 1c). Button 342 in the side of chessman 341 shuts off power to the motor 570 in a manner to be described later in the wire bonder control section. By pressing button 342, the operator ensures continuous operation of the wire bonder with, however, certain delays built into the bonder. Chessman 341 rests on smooth pads on a smooth horizontal surface on the main frame of the wire bonder. The operator moves chessman 341 in any direction. Shaft 344 pivots about bearing 345 connected to fixed, lower manipulator plate 348 and extends through a hole in plate 348 to make hinged but firm contact with top plate 347. Thus motion of chessman 341 by a given amount moves top plate 347 by a related amount controlled by the ratio of the length of shaft 344 beneath the pivot point in bearing 345 to the length of shaft 344 above this pivot point. This ratio can be easily varied and typically is on the order of 8 or 10 to one. Thus the operator is easily able to move top manipulator plate 347 together with the attached structure which includes the feed block support 130c, the feed block 130 with the attached bonding tool 101 and the head drive assembly and drive linkages (shown in FIGS. 3a through 3i) and the bonding head assembly (shown in FIGS. 2a through 2g). FIG. 6e shows in more detail bearing 345 fixed to bottom manipulator plate 348. Bearing 345 contains four set screws 345a through 345d, each set screw being perpendicular to its two adjacent set screws. By adjusting set screws 345a through 345d, the operator controls the position to which shaft 344 is moved. Thus when shaft 344 is moved to position 370a, bonding tool 101 (FIG 2a) is directly above a selected package lead. When shaft 344 is moved to position 370b, tool 101 is directly above a second package lead. Thus the operator automatically positions bonding tool 101 above the package lead without having to view the package leads to determine that they are in the beam of spotlight 6 (FIG. 1a).

Spring 351 (FIG. 6a) attached to the underside of top plate 347 and to bottom plate 348 by hanger 351a draws top plate 347 back to a standard position in the absence of operator control.

Carrier Index

Figures 7A, 7B, 7C:
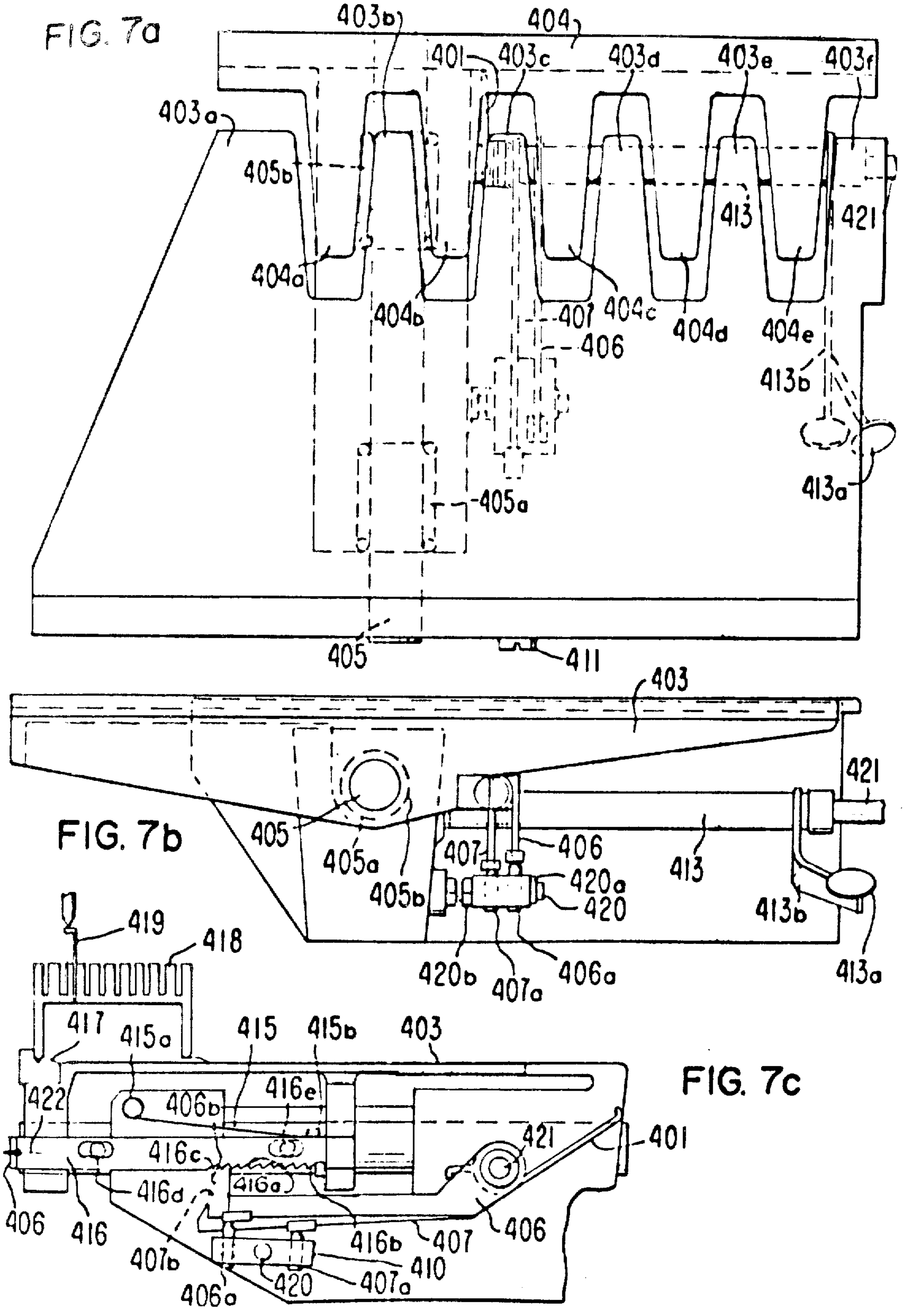
FIG. 7*a* through 7*c* show the carrier index assembly used to index the carrier carrying the lead frame strips such that each strip is sequentially alligned with the heat rail.

The lead frame strips containing the semiconductor dice and package leads between which lead wires are to be bonded are transported in a carrier 418 (FIG. 7c). FIGS. 7a, 7b, and 7c show the indexing mechanism for properly locating the lead frame strip carrier 418. As shown in FIG. 7c, carrier 418 is mounted on the top surface of carrier deck 403. Carrier 418 is properly located on this surface by means of locating block 417. Block 417 contains a groove in its top surface for receiving one leg of carrier 418. Placed in vertical slots in the top surface of carrier 418 are a plurality of lead frame strips 419 (FIG. 7c) of which for simplicity only one is shown.

Carrier deck 403 moves in the direction shown by arrow 422 (FIG. 7c) as a result of a force applied to carrier deck 403 by negator spring 415. Spring 415 is attached to the frame of the die bonder by screw 415a and to carrier deck 403 by means of screw 415b.

Load rachet assembly 416 is attached to carrier deck 403 (FIG. 7c). Deck 403 however is rigidly mounted on shaft 405 which in turn is slideably attached to carrier base 404 (FIG. 7a) which is rigidly attached to the wire bonder frame. Carrier deck 403 and shaft 405 slide along on bushings 405a and 405b mounted in the carrier base 404 (FIGS. 7a and 7b).

Load rachet assembly 416 is adjustably attached to carrier deck 403 by set screws 416d and 416e (FIG. 7c). On the bottom surface of ratchet assembly 416 are teeth 416a possessing a saw tooth shape. Normally point 406b of pawl 406 engages the flat surface of one of these teeth preventing carrier deck 403 from being pulled in the direction of arrow 422 by negator spring 415. When the lead frame strip 419 contained in carrier 418 is to be aligned with slot 188b (FIGS. 5d, 5e), the operator presses button 413a attached by lever 413b to annular cylindrical coupling 413 (FIG. 7b). Depressing button 413a depresses pawl 406. Pawl 406 pushes on button 406a contained in pivot block 410. Rotating about shaft 420, pivot block 410 forces the point 407b (FIG. 7c) of pawl 407 up into contact with the tooth surface just disengaged by point 406$b$ of pawl 406. However, point 407$b$ is one-half the tooth pitch further removed from shaft 421 about which pawls 406 and 407 rotate than is point 406$b$ of pawl 406. Consequently, carrier deck 403 is pulled one-half the tooth pitch in the proper direction by negator spring 415. However, point 407$b$ of pawl 407 catches and stops carrier deck 403 from going further. When the operator releases button 413$a$, pawl 406 is driven by pawl spring 401 back into contact with the vertical surface of the next tooth 416$a$ on the bottom of rachet 416. Consequently, carrier deck 403 moves to the left in the direction of arrow 422 the remaining tooth pitch distance. Pawl 406 prevents carrier deck 403 from moving again in the direction of arrow 422 until button 413$a$ is pressed again.

The position of carrier deck 403 with respect to carrier base 404 is controlled by adjustment screw 411 (FIG. 7$a$). Screw 411 adjusts the position of rachet 416 with respect to set screws 416$d$ and 416$e$ attached to the bottom of carrier deck 403. Carrier deck 403 contains finger-like protrusions 403$a$ through 403$f$ which mate with voids between similar finger-like protrusions 404$a$ through 404$e$ on carrier base 404 (FIG. 7$a$).

While FIGS. 7$a$ through 7$c$ show the carrier deck used to hold the carrier 418 containing lead frame strips with semiconductor dice to which lead wires are to be bonded, the wire bonder of this invention also has a similar carrier indexing structure for holding and indexing the carrier containing the lead frame strips as they come off the die bonder. This structure is substantially identical to the structure shown in FIGS. 7$a$ through 7$c$ except that the carrier is driven in the opposite direction from the carrier just described. For simplicity, this carrier deck for holding the carrier containing the completed lead frame strips will not be described in detail. The use of a vertical lead frame strip has a significant advantage over the horizontal lead frame strips of the prior art. The lead frame strips are stored vertically in their carriers. Thus the lead wires connecting semiconductor dice to the package leads are all visible when the lead frame strips are stored in their carriers. Thus, visual inspection of the wire bonding process is considerably simplified over the inspection of this process with prior art lead wire bonders.

Timing Diagrams

FIGS. 8$a$ through 8$g$ show timing diagrams of use in explaining the operation of this wire bonder. FIGS. 8$a$, 8$b$ and 8$c$ show the movements of wire bonding tool 101, clamp 102$b$, and torch tube 122$a$, respectively, (FIGS. 2$a$ to 2) as a function of the angular position of shaft 510 on which are mounted cams 501 through 503. FIGS. 8$d$, 8$e$ and 8$f$ show the motion of the index finger bar support, the index fingers and the clamp paddle, respectively, as a function of the angular position of shaft 310. Finally, FIG. 8$g$ shows the portion of each cycle of shaft 510 that air is used to draw back wire 109 while bonding tool 101 traverses from the wire bond on a semiconductor die to the package lead. This prevents unwanted bends and loops from forming in the wire between the semiconductor die and the package lead. The abcissa of all figures is thus the angular position of either shaft 510 or shaft 310 in degrees. It should be noted that shaft 510 completes two revolutions for every revolution of shaft 310 on which are mounted cams 301, 302 and 303. This is because every transistor must have two complete wire bonds formed from the semiconductor device to the package leads.

As shown in FIG. 8$a$, bonding tool 101 (FIG. 2$a$) is held above the contact area at the work level while shaft 510 rotates from about zero degrees to five degrees. Then tool 101 begins a linear descent with angular position of shaft 510 to the surface to which the wire is to be bonded. At 45° the rate of descent slows abruptly and by 85°, tool 101 has contacted the work surface. Depending on the height of the semiconductor device, this contact comes somewhere between 50° and 85° rotation of shaft 510. The lead wire is bonded to the semiconductor device while shaft 510 rotates between 85° and 95°. Then between 95° and 129° rotation of shaft 510, bonding tool 101 rises steadily from the semiconductor die's contact area and remains a selected distance above this surface until 139° when it begins to descend at a given rate toward the package lead (also called the "post") to form the "post bond". At 179° the rate of descent slows. Between 200° and 221°, tool 101 has come into contact with the package lead and the post bond has been formed between the wire and the package lead. At 221°, tool 101 begins a rapid rise to its rest position, approximately one-fourth inch above the bonding area. From 265° to 5° into the next cycle of shaft 510, the tool 101 remains a fixed distance above the bonding areas. During this time, torch tube 122$a$ is rotated past the tip of wire 109 (FIG. 2$a$) to form ball 109$a$ on the end of this wire. At 5° into the next cycle of shaft 510, this bonding cycle begins again and is repeated to form the second wire bond between the semiconductor die and the second package lead. When the semiconductor die contains a transistor, the lead wire is usually first formed between the base of the transistor and one package lead and then between the emitter of the transistor and the other package lead. This sequence can, of course, be reversed if desired.

FIG. 8$b$ shows the operation of the wire clamp cam. From 0° to 153° rotation of shaft 510, wire clamp 102$b$ remains open allowing wire 109 (FIG. 2$a$) to travel freely through tool 101. From 153° to 220°, wire clamp 102$b$ is pushed shut thereby at 220° holding securely the wire between clamp 102$b$ and left side clamp 102$a$. At 221°, as described above in conjunction with FIG. 8$a$, the tool 101 begins to rise. Clamping of wire at 220° results in breaking the wire at the heel of the bond. The wire remains clamped until shaft 510 rotates to 310° at which time, after the ball 109$a$ has formed on the end of the wire, clamp 102$b$ is gradually opened until at 355° clamp 102$b$ is completely open. This movement repeats itself with each complete rotation of shaft 510.

FIG. 8$c$ shows the movement of torch tube 122$a$ in response to flame-off cam 502. Tprch tube 122$a$ remains stationary until shaft 510 rotates 235°. Then from 235° to 265° the torch tube rotates at one rate while from 265° to 310° the torch tube rotates in the same direction at a slightly slower rate. During this portion of the cycle, the flame from torch tube 122$a$ melts the end of wire 109 (FIG. 2$a$) and forms ball 109$a$ on the end of this wire. From 310° to 350° torch tube 122$a$ is returned to its normal stationary position. This cycle repeats each time after the wire 109 is clamped and broken. Ball 109$a$ on the end of wire 109 is formed before the wire is unclamped, thereby preventing the wire from being pulled through bonding tool 101 (FIG. 2$a$).

Figures 8A, 8B, 8C, 8D, 8E, 8F, 8G:
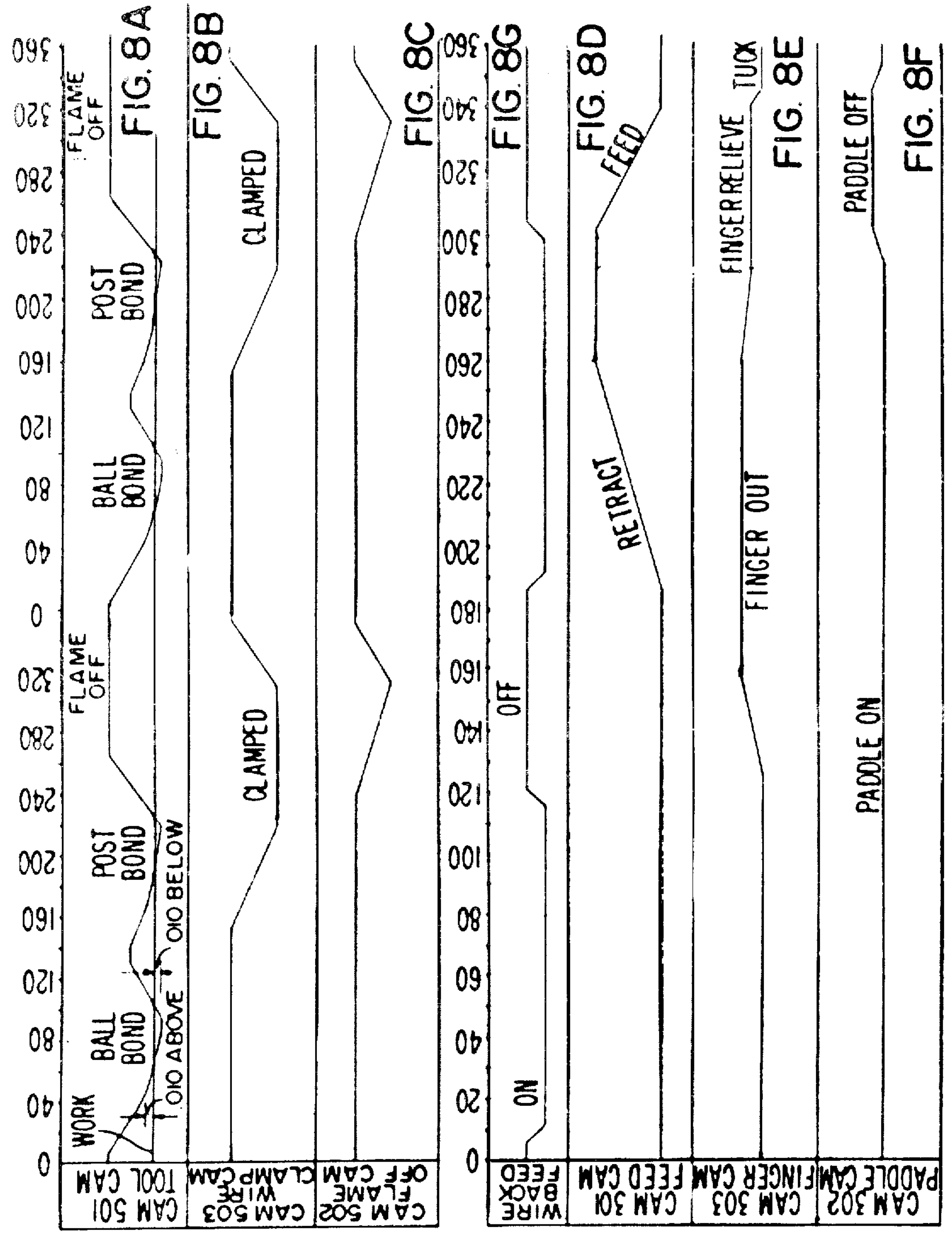
FIGS. 8*a* through 8*g* show the timing diagrams useful in explaining the operation of the wire bonder of this invention.

FIG. 8$d$ shows the movement of the index finger bar support in response to feed cam 301. The abscissa of diagrams 8*d* through 8*f* is the angular position of shaft 310 on which cams 301 through 303 are located. Shaft 310 makes one complete rotation for every two revolutions of shaft 510. For the first 185° rotation of shaft 310, the index finger bar support mechanism is held stationary. The fingers contained on the index finger bar are inserted for the first 125° of rotation of shaft 310 into the lead frame strip (FIG. 8*e*). Between 125° to 157° rotation of shaft 310 the fingers are retracted from the lead frame strip. From 157° to 260° the fngers remain outside of the lead frame strip (FIG. 8*e*). From 185° to 260° rotation of shaft 310, the index finger bar support mechanism is retracted to the left (FIG. 8*d*). From 260° to 300° the index finger bar support mechanism is held stationary in its left-most position. From 260° to 285°, the fingers are reinserted into the lead frame strip (FIG. 8*e*). From 300° to 340°, the index finger bar support mechanism is driven to the right at a constant rate. At 340° the index finger bar support mechanism reaches its right-most position and again is held stationary. However, the index fingers themselves are tucked against the lead frame strip from 340° to 345° to press the lead frame strip firmly against the heater block prior to the wire bonding operation. While these motions are taking place, cam 302 is driving the clamp paddle as shown in FIG. 8*f*. The clamp paddle presses against the lead frame strip from 0° to 290° rotation of shaft 310. From 290° to 300°, the clamp paddle is withdrawn from pressing against the lead frame strip. At 300°, the lead frame strip begins to move to the right again (FIG. 8*d*). From 300° to 345°, the clamp paddle remains out of contact with the lead frame strip allowing the lead frame strip to be moved. At 345°, while the index fingers are tucking the lead frame strip against the heater block, the clamp paddle is again pushed against the lead frame strip. At 355°, the clamp paddle is fully pressing against the lead frame strip and holding the lead frame strip in position preparatory to the next sequence of wire bonds formed between the semiconductor die and the package leads contained in the lead frame strip.

FIG. 8*g* shows the condition as a function of rotation of shaft 510, of the wire backfeed used to prevent crimps and bends from forming in the wire between the bonds on the semiconductor die and the bonds to the package post. A gas such as air or nitrogen is used to pull the wire up through bonding tool 101 (FIG. 2*a*) during the period bonding tool 101 travels from the semiconductor die to the package lead. From 10° to 25° motion of shaft 510, while the bonding tool 101 is dropping to contact the semiconductor die, the wire backfeed gas is turned on. From 25° through slightly more than 230°, the wire backfeed gas remains on. Thus the wire is gently pulled back through tool 101 to take up any excess in the wire while the tool 101 moves from having made a bond on the semiconductor die to the proper position on the backage lead for the next bond. This prevents crimping and other undesired bending in the wire. From about 233° to 250° rotation of shaft 510, the gas is turned off. The gas remains off until 10° into the next cycle of shaft 510 when this cycle begins again.

Bonder Control

The cyclical operation of the wire bonder continues so long as the operator presses button 342 on manipulator chessman 341.

Figure 9A:
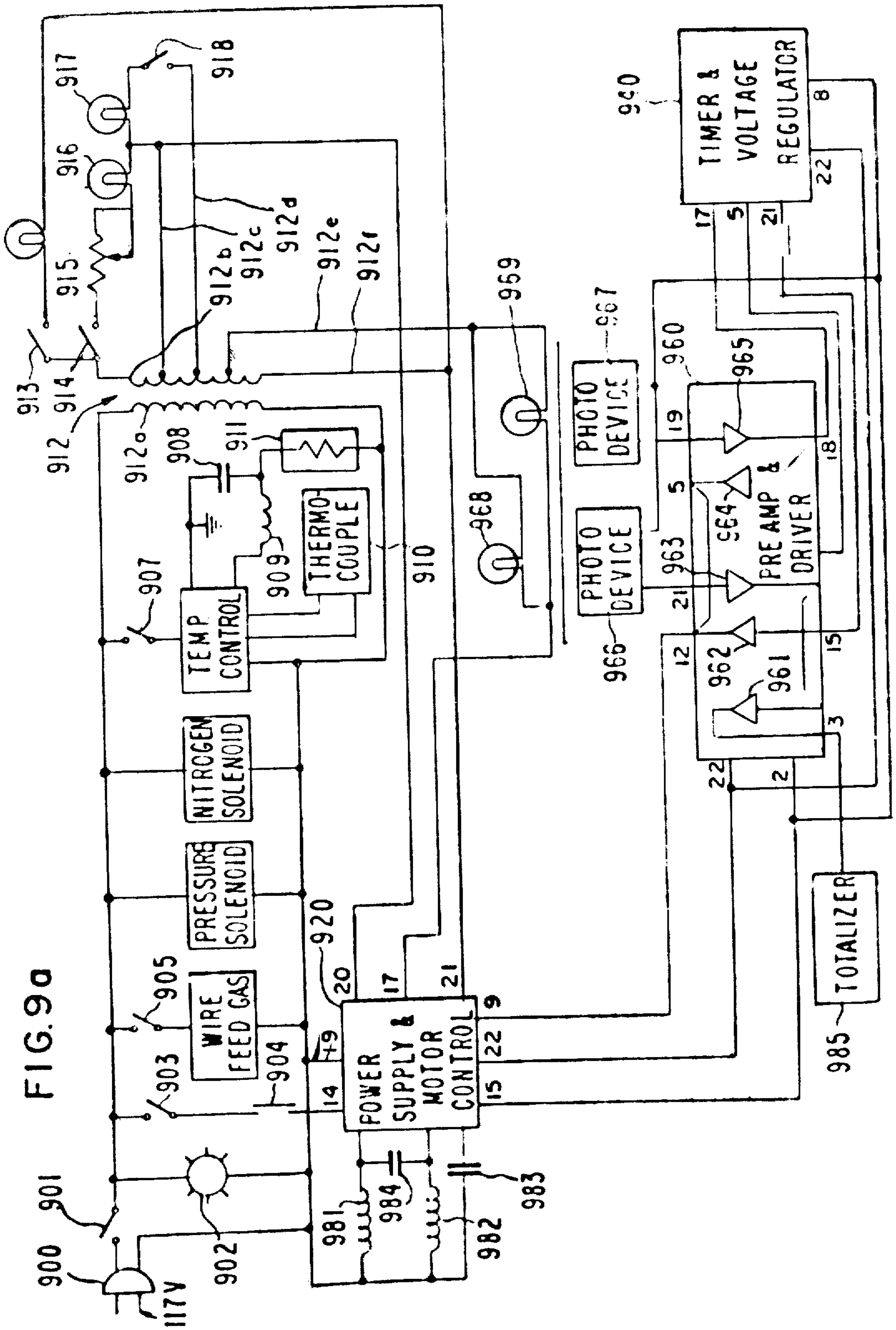
FIGS. 9*a* through 9*f* show the electronic control circuits used in the wire bonder of this invention.

FIG. 9*a* shows schematically the circuit used to control the operation of the wire bonder. 117 volt A.C. power is applied to the system through plug 900. The operator turns on the power by closing switch 901. Light 902 glows when the power is on. By closing switch 901, power is supplied to the pressure solenoid which opens a valve to supply air to the air bearings on which top manipulator plate 347 moves. When the air pressure is above a threshold pressure, motor interlock switch 904 closes, supplying power to the power supply and motor control 920. Switch 905 turns on the wire feed gas which, as described in conjunction with FIG. 8*g*, prevents the lead wire from bending during the bonding operation. Closing switch 901 also activates the nitrogen solenoid thus supplying nitrogen to the heat gas tube in the heater block assembly. Switch 907 must be closed to turn on the temperature controller. The temperature controller responds to signals from the thermocouple 189*c* placed in the heater block (FIG. 4*b*) just beneath the wire bonding point to hold the temperature of the heater block at the proper temperature to form the wire bonds. The temperature controller supplies current through inductor 909 to the main heater 911. Bypass capacitor 908 filters out high-frequency noise. In addition, a switch is provided to supply power to heat bonding tool 101 (FIG. 2*a*).

Power is also supplied through primary winding 912*a* of transformer 912 to the secondary winding 912*b* of this transformer. Pressing of switch 913 allows the operator to turn on a light which calls the supervisor to the wire bonder. Pressing of switch 914 supplies current through adjustable resistor 915 to light bulb 916 which illuminates the semiconductor die and package leads to which the lead wire is to be bonded. Closing switch 918 supplies light to spotlight 917 which shines on the locations above which the operator must place bonding tool 101 to form the wire bonds properly.

The secondary winding 912*b* has, in one embodiment, a total A.C. voltage across it of 24 volts. Leads 912*c* and 912*f* are connected to pins 20 and 21 respectively on power supply 920. Five volts is supplied through pin 17 on power supply 17 on power supply 920, and lead 912*e*, to lights 968 and 969, which activate, through slots in disc 575 on shaft 550 (FIG. 3*f*) driven by motor 570 (FIG. 3*c*), photodevices 966 and 967, respectively. Lights 968 and 969 and photodevices 966 and 967 are contained in housings 576*a* and 576*b* FIG. 3*f*).

The main drive motor 570 (FIG. 3*c*) is represented by inductors 981 and 982 and capacitor 984 (FIG. 9*a*). Capacitor 983 stores braking charge to stop the motor promptly.

Figure 9B:
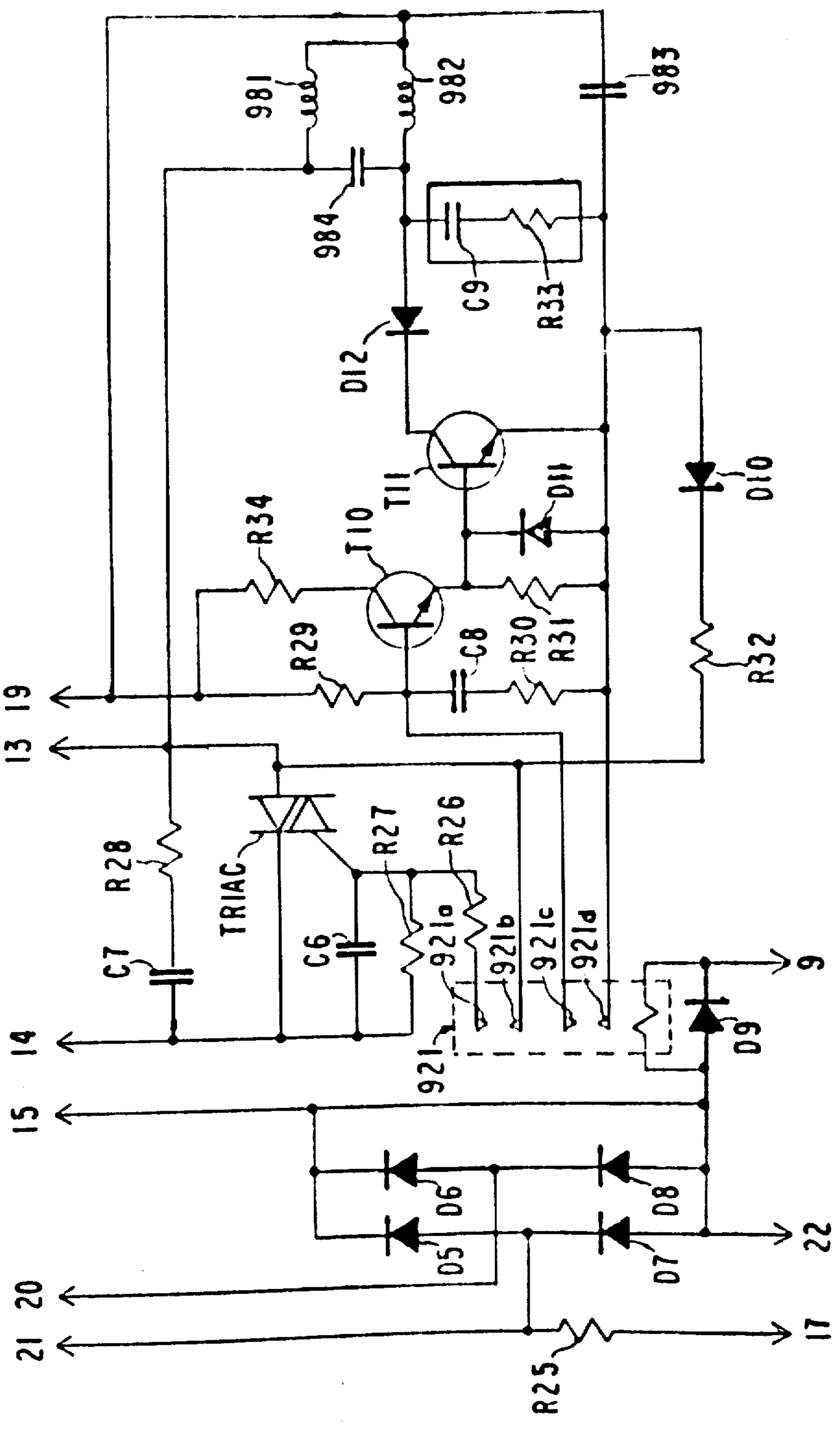
Figure 9C:
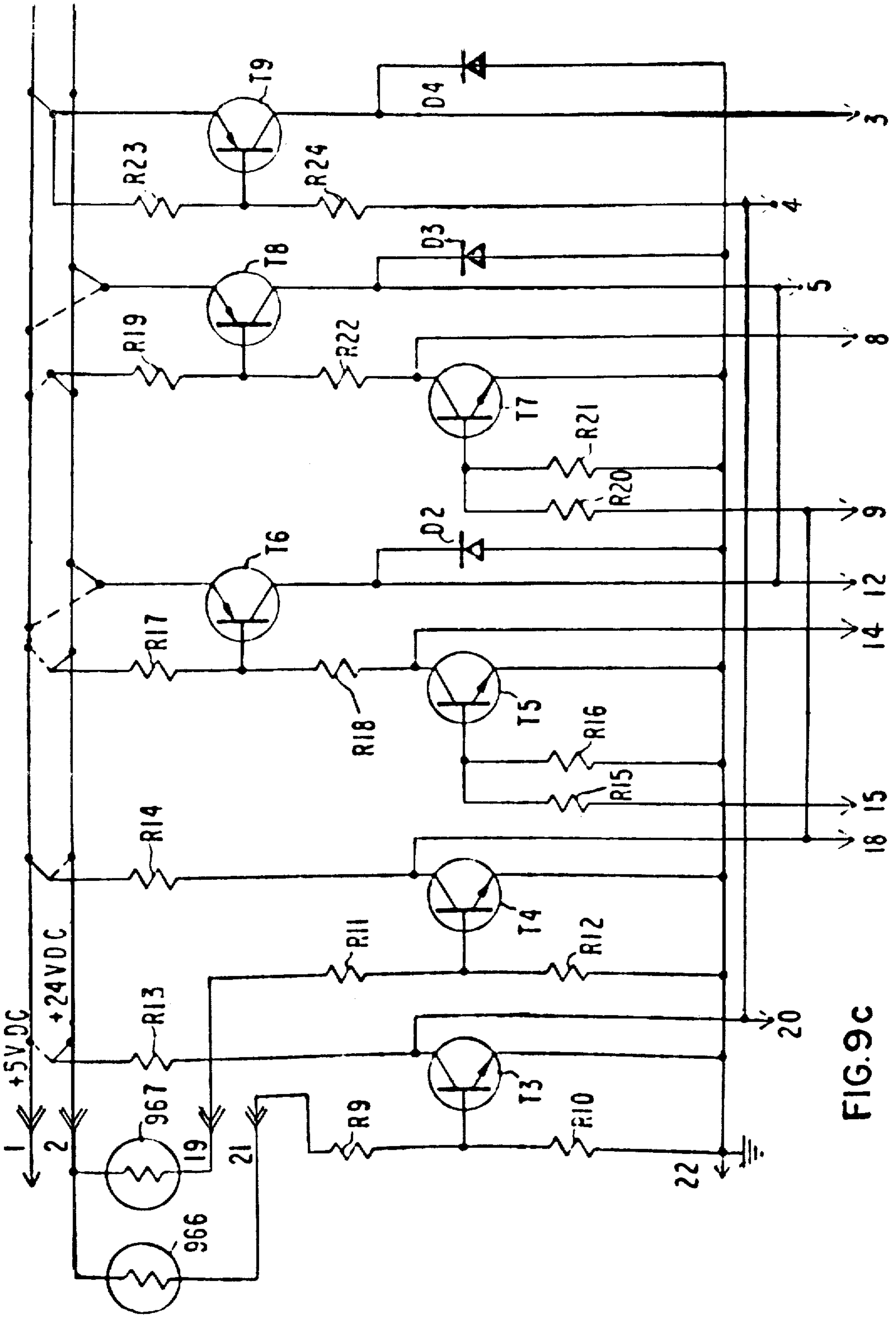

FIG. 9*c* shows in detail the preamp and drive circuit 960. Photodevices 966 and 967 contain resistances which decrease in response to incident light. Device 966 receives light from bulb 968 while device 967 receives light from bulb 969. As the resistance of device 966 drops, the current through this device and thus through resistors R9 and R10 increases. The increase in current across resistor R10 increases the voltage across this resistor and thus turns on normally-off transistor T3. The current through collector resistor R13 lowers the output voltage on the collector of T3. This output voltage on pin 20 is then transmitted from pin 20 to pin 4. The drop in collector voltage on transistor T3 causes current to flow through resistors R23 and R24 thereby turning on normally-off PNP transistor T9. The turning on of transistor T9 produces a signal which is transmitted on pin 3 from preamp and driver 960 to totalizer 985 (FIG. 9a). The total count displayed by totalizer 985 thus increases by one. When the operator presses the switch 342 (FIGS. 6c and 9a), power is supplied to motor 570 (FIG. 3c) except when slots in disc 575 (FIGS. 3f and 9a) allow light from bulb 969 to fall on photodevice 967. Thus when no light is incident on photodevice 967, this device has a large impedance preventing transistor T4 from being turned on. The collector voltage on transistor T4 is thus high. This high level voltage is transmitted from pin 18 to pin 9 of preamp and driver circuit 960 and from pin 9, through resistor R20 to the base of transistor T7. Transistor T7 is thus turned on. The collector current of transistor T7 is drawn through resistors R19 and R22. Connected at the node of these latter two resistors is the base of PNP transistor T8. The voltage drop across resistor R19 created by the collector current of transistor T7 turns on transistor T8. The collector signal from transistor T8 is transmitted from pin 5 to pin 12 of preamp and driver circuit 960 and from pin 12 to pin 9 of powewr supply and motor control circuit 920 thereby activating relay 921 (FIG. 9b) and bringing together contact points 921a and 921b, and also bringing together contact points 921c and 921d.

As will be seen later, the input voltage on pin 15 of preamp and driver circuit 960, which is supplied through resistor 415 to the base of transistor T5, is a low level signal during most of the operation of motor 570. This low level signal holds off NPN transistor T5. The high level collector voltage on transistor T5 in turn holds off PNP transistor T6. But because transistor T8 is normally on, and the high level collector voltage of transistor T8 is also transmitted from pin 12 of circuit 960 to relay 9, relay 9 is held on.

Twice each cycle of shaft 550 (and thus of shaft 510) light from bulb 969 passes through slots in disc 576 (FIGS. 3f and 9a) to activate photodevice 967 (FIG. 9c) to turn off the normally-on motor. The decrease in resistance of device 967 results in an increase in current through resistors R11 and R12 thereby turning on normally-off transistor T4. The collector current of transistor T4 passes through collector resistor R14 thereby dropping the collector voltage on T4. This voltage is transmitted from pin 18 to pin 9 of preamp 960 and there through resistor R20 to the base of transistor T7. The sudden drop in the collector voltage of transistor T4 turns off transistor T7. Consequently, the collector voltage of transistor T7 rises to approximately the supply voltage of 24 volts (received from power supply 920 on pins 2 and 22 of preamp and driver 960). Thus the base voltage of transistor T8 at the node between bias resistors R19 and R22 goes approximately to the emitter voltage of transistor T8 thereby shutting off transistor T8. Consequently, the output on pin 5 from preamp and driver 960, which is transmitted to pin 12 and there taken to pin 9 on power supply and motor control 920 (FIG. 9b), drops from a high to a low level. As described above, a high level signal on pin 9 of control 920 (FIG. 9b) operates relay 921 to bring together points 921a and 921b and also to bring together points 921c and 921d. The receipt of the low level signal from the collector of transistor T8 thus turns off relay 921, separating these two sets of contacts. This shuts off the current through resistor R26 to the gate of the triac thereby switching the triac from its low impedance to its high impedance state. Accordingly, no current is supplied to the main drive motor 570 and the main drive motor shuts off. Resistor R27 and capacitor C6 filter high frequency noise to prevent the triac from being triggered by this noise.

Figure 9D:
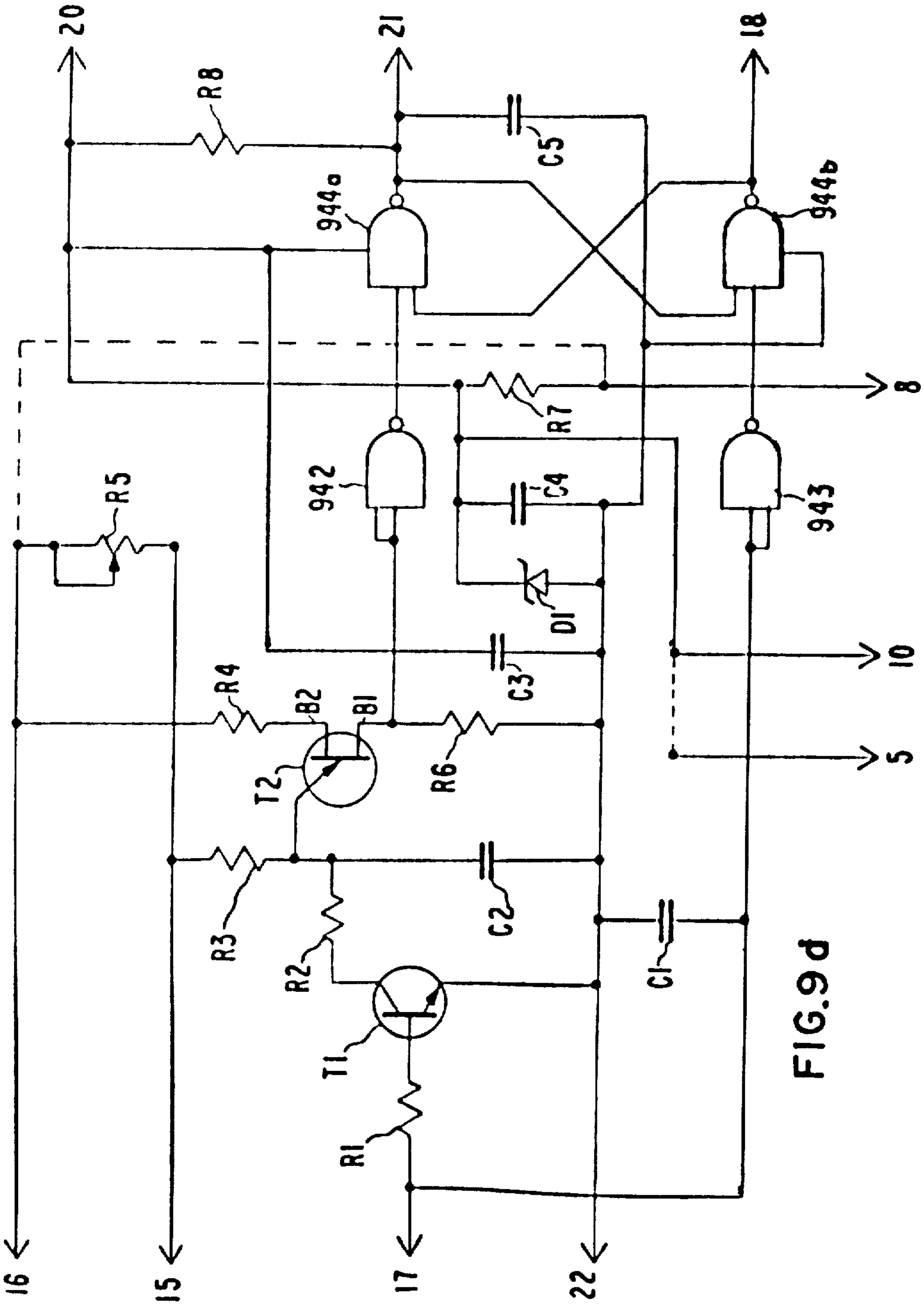

The output pulse from transistor T4 (FIG. 9c) is also transmitted from pin 18 of preamp and driver 960 to pin 17 of timer and voltage regulator 940 (FIG. 9d). The drop in collector voltage on transistor T4 from high to low is transmitted through resistor R1 to the base of normally-on transistor T1. The sudden drop in base voltage on this transistor turns off this transistor thereby providing a high impedance to the current which normally flows through resistors R3 and R2 to the emitter of transistor T1.

A DC voltage is applied to pin 8 of the timer and regulator circuit (FIGS. 9a and 9d). This voltage, derived from pin 15 of power supply and motor control 920 (FIGS. 9a and 9b), is then transmitted through resistor R7 (FIG. 9d) and zener diode D1, connected as a voltage divider, to the common lead, pin 22 of the timer and voltage regulator circuit 940. This common lead is connected back to pin 22 of power supply and motor control 920 (FIGS. 9a and 9b). The voltage drop across zener diode D1 is held at 5 volts. Thus five volts is maintained on pin 20 from timer and voltage regulator circuit 940 and likewise 5 volts is supplied to elements 944a, 944b, 942 and 943, which in the preferred embodiment are all part of one integrated circuit. Elements 944a and 944b comprise a flip-flop circuit. The 24 volts on pin 8 are also transmitted through variable resistor R5 and then through resistors R3 and R2 to the collector of transistor T1. Thus when transistor T1 is shut off, the current which passes through resistors R5 and R3 charges capacitor C2. Connected at the node between capacitor C2 and resistor R3 is the emitter of unijunction transistor T2.

Unijunction transistor T2 is normally in its high impedance state. When, however, capacitor C2 charges to a given voltage, the charge accumulated on capacitor C2 discharges through the emitter to base B1 of this transistor. The time necessary for capacitor C2 to charge to a voltage sufficient to discharge through unijunction transistor C2 is varied by adjusting resistor R5. This resistor can be varied from 500K ohms to zero ohms. Consequently, the delay introduced by this resistor in series with resistor R3 and capacitor C2 varies from 0.3 seconds down to about 0.01 seconds. By varying the size of R5 and C2, other delays can also be used with this invention.

The discharging of capacitor C2 to base B1 of unijunction transistor T2 creates a positive voltage pulse across resistor R6. This voltage pulse is transmitted as a negative pulse through inverting amplifier 942 to one input lead of element 944a in the flip-flop composed of elements 944a and 944b.

Elements 944a and 944b each produce a high level output signal in response to a low level input signal on either one or both input leads. These elements produce a low level output signal only when both input leads contain high level signals. Normally the signal on pin 17 derived from the collector voltage of transistor T4 (FIG. 9c) is high level. Thus the output signal from element 944b is high level. This high level signal is transmitted to one input lead of element 944a. The other input lead to element 944a also has a normally high level signal thus insuring that the output signal from element 944a is normally level. This low level signal from element 944a is transmitted from pin 21 of the timer and voltage regulator 940 (FIGS. 9*d* and 9*a*), through start switch 342 (FIGS. 6*c* and 9*a*), to pin 15 (FIGS. 9*a* and 9*c*) at the input lead of preamplifier 962 in preamp and driver circuit 960, and then through resistor R15 (FIG. 9*c*) to the base of transistor T5 thereby keeping transistor T5 normally off.

However, the negative pulse from inverting amplifier 942 generated by the discharge of capacitor C2 through unijunction transistor T2, switches the output signal from element **944*a* from low to high level. This high level signal is fed back to one input lead of element 944*b*. On the other input lead to element 944*b* is the high level output signal from element 943** generated by the low level output signal produced by the turning on of transistor T4 (FIG. 9*c*). Thus the output signal from element **944*b*** switches from high level to low level.

The high level output signal from element **944*a* is transmitted from pin 21 of timer and voltage regulator circuit 940** (FIG. 9*a*) through switch 342 (FIG. 6*c*) to pin 15 on preamp and driver circuit 960 (FIGS. 9*a* and 9*c*). The high level signal from element **944*a* turns on transistor T5. The collector current of transistor T5 passes through resistors R17 and R18 thereby turning on PNP transistor T6. The high level signal produced on the collector of transistor T6 is transmitted from pin 12 on preamp and driver circuit 960 to pin 9 of power supply and motor control 920. This high level signal there activates relay 921 bringing contact points 921*a* and 921*b* together and also bringing contact points 921*c* and 921*d*** together. Consequently, gate current is again supplied to the triac, changing the triac from its high impedance to its low impedance state thereby to allow current to be supplied to the motor.

After motor 570 turns on, the slot allowing light from bulb 969 to fall on photodevice 967 is rotated out from between these two elements. Consequently, the resistance of photodevice 967 increases to a large value again thereby turning off transistor T4. The collector voltage on transistor T4 thus rises to a high level. This high level voltage is transmitted to pin 17 (FIG. 9*d*) of timer and voltage regulator circuit 940. There, this high level signal is inverted by inverting amplifier 943 and applied as a low level signal to one input lead of element **944*b*. This results in the output signal from element 944*b* switching from a low level to a high level. Applied to one input lead of element 944a, this high level output signal from element 944b results in the output signal from element 944*a* switching from high level to low level. This occurs, it should be noted, because the normal output signal from element 942 which is applied to the other input lead to element 944*a* is a high level signal except when capacitor C2 discharges through transistor T2 and across resistor R6. Thus a low level signal is now applied through pin 15 on circuit 960** (FIG. 9*c*) to the base of transistor T5 turning off transistor T5. The turning off of transistor T5, however, does not cause a low level signal to be applied through pin 9 to relay 921 in power supply and motor control circuit 920. Rather, the high level collector voltage from transistor T4 turns on transistor T7 and results in a high level collector voltage being produced by transistor T8. This high level collector voltage is applied through pins 5 and 12 of preamp and driver circuit 960 to pin 9 of power supply and motor control circuit 920 thereby holding relay 921 on.

It should be noted that the motor remains on as long as transistor T8 conducts. Once the motor is shut off, however, it is turned on again by transistor T6 conducting in response to a shift in the level of output signal from element 944a. This shift occurs in response to the discharge of capacitor C2 through transistor T2 and across resistor R6. Once the motor is running and the slot in disc 575 has moved out from between light 969 in photodevice 967, the flip-flop consisting of elements 944a and 944b is not likely to be falsely triggered. Thus in most cases noise will not falsely stop the motor.

It should be noted that when the level of the output signal from element 944a switches from low to high, this high level signal is transmitted from timer and voltage regulator circuit 940 to preamp and driver circuit 960 only when the operator has button 342 pressed. Until button 342 is pressed, the motor will not turn on even though the built-in time delay in circuit 940 has expired.

FIG. 9*b* shows the power supply and motor control circuit 920. An 18 volt signal from transformer 912 (FIG. 9a) is transmitted on pins 21 and 20 to a rectifying circuit consisting of diodes D5 through D8 and capacitor C5. An A.C. signal is also transmitted through resistor R25 to lights 968 and 969 (FIG. 9*a*) to provide 5 volts across the filaments of these lights. Diode D9 prevents a reverse voltage from developing across relay 921.

When relay 921 is closed, contacts 921c and 921d short circuit the base and emitter of transistor T10 thereby holding this transistor off. Consequently, the base-emitter voltage of transistor T11 is held beneath the turn-on voltage and transistor T11 remains off, presenting a high impedance to the circuit. When contacts 921a and 921b separate, due to photodevice 967 receiving light, the triac switches from its low impedance to its high impedance state and thus current is no longer supplied to the main motor. The separation of contacts **921*c* and 921*d* allows braking current to flow from capacitor 983 to stop the motor. While the triac turns off, capacitor C8 charges. When transistor T10 turns on in response to the charging of capacitor C8 through resistors R29 and R30, the braking current from capacitor 983** turns on.

Capacitor 983 was charged through diode D10 and resistor R32 connected to lead 13 during the portions of each cycle that the 117 volt A.C. signal supplied on lead 14 went negative with respect to the voltage on lead 19 while the triac was in its low impedance state. When transistor T10 turns on, its emitter current passes through resistor R31 and thus increases the base voltage on transistor T11, turning on this transistor. The collector current of transistor T11 flows through diode D12 and through capacitor 984 and inductors 981 and 982, parts of the main drive motor 570. The emitter current of T11 then flows through capacitor 983 thereby discharging capacitor 983 and thus braking the main drive motor.

While structure for shutting off the motor twice each complete rotation of shaft 510 has been described, by changing the number of slots in disc 575 (FIG. 3*f*) the motor can be shut off a different number of times each cycle of shaft 510 if desired. Furthermore, by changing the position of slots in disc 575, the times in each wire bonding cycle at which the motor is shut off can be varied. Typically, the motor is shut off while bonding tool 101 (FIG. 2*a*) rests on a semiconductor die or package post during the formation of a bond between the lead wire and the underlying material. While this dwell time can also be varied by varying the shapes of the cams, electrical delays are more suitable for this purpose as such delays can be change more easily.

In addition, if desired, the electronic delay associated with the formation of the wire bond on the semiconductor die can differ from the electronic delay associated with the formation of the wire bond to the package post. This is done most easily by adding photocell 967*a* and lamp 969*a* (both shown in dashed lines) to the circuit shown in FIG. 9*a* and another slot on a different radius in disc 575 to actuate this new photocell.

Figure 9E:
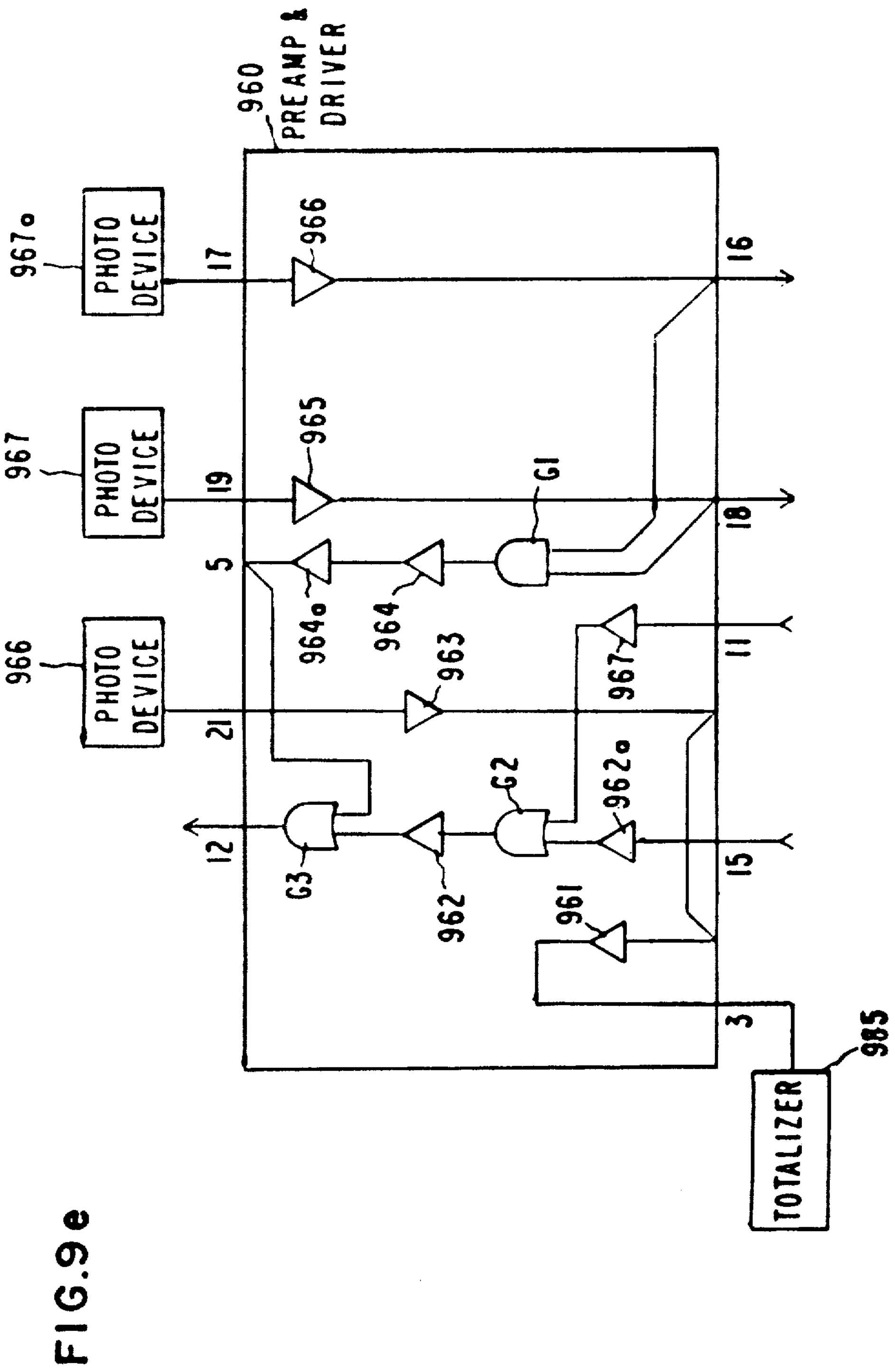

FIG. 9*e* shows the signal path followed by the signal from photodevice 967*a*. The signal from photodevice 967*a* passes through amplifier 966 and from amplifier 966 is sent through gate G1, amplifiers 964 and 964a and gate G3 to pin 12 of preamp and driver 960. From pin 12 this signal is sent to pin 9 of power supply and motor control where it shuts off the motor, as described earlier. This signal is also sent on pin 16 to a timer and regulator circuit identical to that shown in FIG. 9d. The signal transmitted from pin 16 of preamp and driver circuit 960 is input to pin 17 of the timer circuit where it actuates the timer consisting of a unijunction transistor and an RC circuit as described above in conjunction with FIG. 9d. When the time delay expires, an output pulse from the timer circuit is transmitted to pin 11 of preamp and driver circuit. From pin 11 this signal is passed through amplifier 967, gate G2, amplifier 962, gate G3, to pin 12 of preamp and driver circuit 960. From pin 12 this signal is sent to pin 9 of power supply and motor control where it turns on the motor as described above. The input signal on pin 11 of preamp and driver circuit 960 behaves in the same manner as does the input signal on pin 15 of preamp and driver circuit as described above in conjunction with the description of FIGS. 9*c* and 9*d*.

Figure 9F:
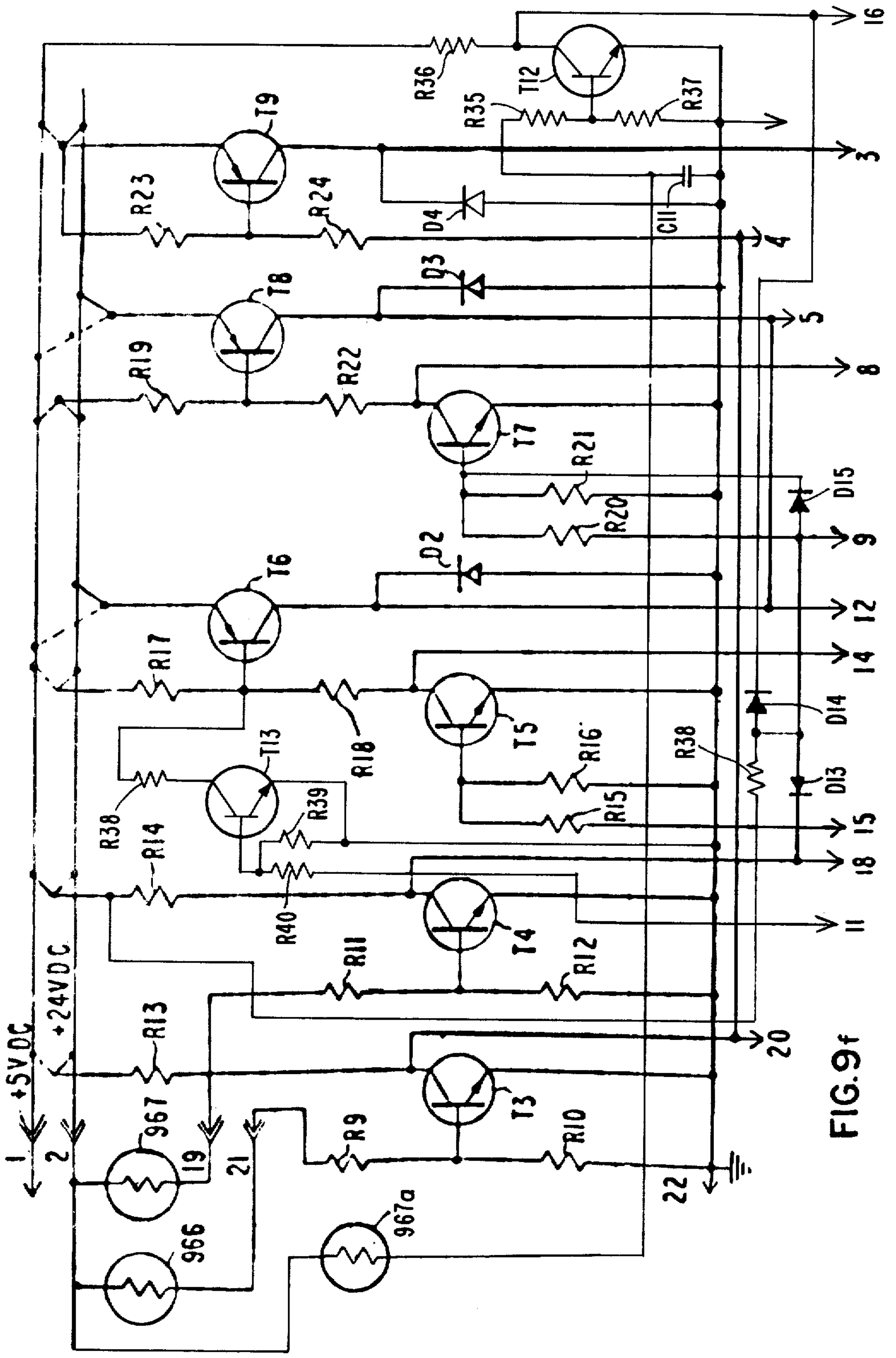

The leads and components shown in dashed lines in FIG. 9*f* show the modifications to the preamp and driver circuit 960 as shown in FIG. 9*a* to be compatible with two independently controlled delays. These added components function identically with their corresponding components actuated by the signal from photodevice 967 and thus their operation will not be described in detail. It should be noted, however, that when transistor T12 is turned on by light striking photodevice 967a, (FIG. 9*f*) diode D13 prevents the output signal on lead 18 from going low and thus triggering the timer associated with photodevice 967. Likewise, when the output signal on lead 18 (FIG. 9*f*) of preamp and driver circuit 960 goes low in response to light striking photodevice 967, diode D14 prevents the output signal on lead 16 from circuit 960 from also going to a low level and thus triggering the timer circuit associated with photodevice 967*a*. Diode D15 ensures that the voltage drop from pin 18 of circuit 960 to the base of transistor T7 is the voltage drop across a forward bias PN junction.

What is claimed is:

1. Apparatus for bonding lead wires between semiconductor dice and package leads, which comprises:

means for heating semiconductor dice and the corresponding package leads;

means for moving said semiconductor dice and said package leads along said means for heating so that each semiconductor die and its corresponding package leads are sequentially in the proper location to have lead wires bonded from the die to the package leads;

means for bonding lead wires between said semiconductor dice and said package leads;

means, movable by a person, for adjusting the position of said means for bonding relative to a semiconductor die or one of its corresponding package leads to place said means for bonding in the proper location to attach a lead wire to said semiconductor die or to said package lead, wherein said means for adjusting includes means, responsive to an operator, for changing the position of said means for bonding relative to said semiconductor die or one of its corresponding package leads, and means for automatically stopping said means for changing when said means for bonding is properly located in relation to any one of the package leads to which said semiconductor die is to be electrically connected;

means for indicating when said means for bonding is in the proper position above a semiconductor die or one of its corresponding package leads for the bonding of wire thereto; and means for supplying power to said means for bonding and to said means for moving.

2. Structure as in claim 1 wherein said means for adjusting includes means for moving said means for bonding and its associated drive mechanism and said means for indicating until said means for bonding is properly positioned above said semiconductor die or one of its corresponding package leads, as appropriate.

3. Structure as in claim 1 wherein said means for adjusting comprises:

fixed plate means containing on its top surface a plurality of bearing surfaces;

movable plate means mounted on said fixed plate, said movable plate means containing on its bottom surface a corresponding matching plurality of bearing surfaces, each surface containing a shaped hole therein;

a plurality of pads each containing a protrusion on its top surface, said plurality of pads being placed between the bearing surfaces of said movable plate means and of said fixed plate means, the protrusions on said pads being inserted into the corresponding holes in the bearing surfaces of said movable plate means, said pads thus rotating about said protrusions to compensate for any angles between the planes of the top bearing surfaces of said fixed plate means and the bottom bearing surfaces of said movable plate means; and means for supplying air to form thin films of air between the bearing surfaces of said fixed plate means and the bottoms of said pads.

4. Structure as in claim 1 wherein said means for moving comprises:

means for moving a lead frame strip containing groups of package leads held together by tie bars, one lead in each group containing thereon a semiconductor die, all but a portion of one lead in each group of leads being held in a vertical plane by said means for moving, while said portion of said one lead contains said semiconductor die and is located in a horizontal plane.

5. Structure as in claim 4 wherein said means for moving comprises:

index finger means;

means for periodically inserting said index finger means into, and withdrawing them from, said lead frame strip;

means for driving said index finger means along said means for heating in one direction when said index finger means are inserted into said lead frame strip, and in the other direction when said index finger means are withdrawn from said lead frame strip, thereby to position properly a semiconductor die and its package leads for the receipt of lead wire supplied by said means for bonding.

6. Structure as in claim 5 wherein said means for moving includes:

means for pressing said lead frame strip against said means for heating during the times said lead wire is being bonded between said semiconductor die and its corresponding package leads.

7. Structure as in claim 1 wherein said means for indicating comprises:

means for supplying a light beam which strikes a contact area on said semiconductor die or one of its corresponding package leads when said means for bonding is directly above said contact area or said package lead; and means through which an operator can visually see that a semiconductor die or a package lead is properly within said light beam prior to actuating said means for bonding.

8. Structure as in claim 1 wherein said means for supplying power to said means for bonding and to said means for moving comprises:

means for automatically cutting off all power supplied to said means for bonding for a first selected time while said means for bonding is bonding a lead wire to a semiconductor die; and means for automatically cutting off power to said means for bonding for a second selected time period while said means for bonding is bonding a lead wire to a package lead.

9. Structure as in claim 1 including:

means for periodically flowing air past the lead wire carried by said means for bonding to pull said lead wire back up through said means for bonding after the bond has been formed between said lead wire and said semiconductor die to prevent said lead wire from crimping or bending between said semiconductor die and a package lead while said bonding tool is moving to said package lead to form a bond there.

10. Structure as in claim 9 wherein said means for supplying air includes:

means for supplying a continuous flow of air through a first supply line; and means for switching said continuous flow of air from a first outlet port to a supply means which directs said air to flow past said wire so as to pull said wire back through said means for bonding while said bonding tool is moving to said package lead to form a bond there.

11. Apparatus for bonding lead wires between semiconductor dice and package leads, which comprises:

means for heating semiconductor dice and the corresponding package leads;

means for moving said semiconductor dice and said package leads along said means for heating so that each semiconductor die and its corresponding package leads are sequentially in the proper location to have lead wires bonded from the die to the package leads;

means for bonding lead wires between said semiconductor dice and said package leads, wherein said means for bonding includes capillary means through which is fed a lead wire, said capillary means being slideably mounted in a support assembly and being weighted by selected weights, said capillary means being pulled upwards by a spring making a selected angle with the horizontal, said capillary means being connected by a lever to a cam, said lever and cam moving said capillary in vertical directions and being driven by a means for supplying power;

means, movable by a person, for adjusting the position of said means for bonding relative to a semiconductor die or one of its corresponding package leads to place said means for bonding in the proper location to attach a lead wire to said semiconductor die or to said package lead, wherein said means for adjusting includes means, responsive to an operator, for changing the position of said means for bonding relative to said semiconductor die or one of its corresponding package leads, and means for automatically stopping said means for changing when said means for bonding is properly located in relation to any one of the package leads to which said semiconductor die is to be electrically connected;

means for indicating when said means for bonding is in the proper position above a semiconductor die or one of its corresponding package leads for the bonding of wire thereto; and means for supplying power to said means for bonding and to said means for moving.

12. Apparatus for bonding lead wires between semiconductor dice and package leads, which comprises:

means for heating semiconductor dice and the corresponding package leads;

means for moving said semiconductor dice and said package leads along said means for heating so that each semiconductor die and its corresponding package leads are sequentially in the proper location to have lead wires bonded from the die to the package leads;

means for bonding lead wires between said semiconductor dice and said package leads;

means, movable by a person, for adjusting the position of said means for bonding relative to a semiconductor die or one of its corresponding package leads to place said means for bonding in the proper location to attach a lead wire to said semiconductor die or to said package lead, wherein said means for adjusting includes means, responsive to an operator, for changing the position of said means for bonding relative to said semiconductor die or one of its corresponding package leads, and means for automatically stopping said means for changing when said means for bonding is properly located in relation to any one of the package leads to which said semiconductor die is to be electrically connected;

means for indicating when said means for bonding is in the proper position above a semiconductor die or one of its corresponding package leads for the bonding of wire thereto; and means for supplying power to said means for bonding and to said means for moving, wherein said means for supplying power includes a motor;

means coupling said motor to a first shaft means rotatably mounted on said apparatus, said first shaft means driving said means for moving, and means flexibly coupling said motor to a second shaft means, said second shaft means being fixed to move with said means for adjusting, said flexible coupling means allowing said second shaft means to be moved freely in a horizontal plane.

13. Structure as in claim 12 wherein said means flexibly coupling comprises:

a first bellows coupling means attached to means for transmitting power from said motor;

a shaft attached to said first bellows coupling means; and a second bellows coupling means coupling said shaft to said second shaft means.

* * * * *